United States Patent
Hoang et al.

(10) Patent No.: US 11,410,727 B1
(45) Date of Patent: Aug. 9, 2022

(54) SCALABLE SEARCH SYSTEM DESIGN WITH SINGLE LEVEL CELL NAND-BASED BINARY AND TERNARY VALUED CONTENT ADDRESSABLE MEMORY CELLS

(71) Applicant: SanDisk Technologies LLC, Addison, TX (US)

(72) Inventors: Tung Thanh Hoang, San Jose, CA (US); Wen Ma, Sunnyvale, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/201,946

(22) Filed: Mar. 15, 2021

(51) Int. Cl.
*G11C 16/08* (2006.01)
*G11C 16/24* (2006.01)
*G11C 15/04* (2006.01)
*G11C 16/30* (2006.01)
*G11C 16/34* (2006.01)

(52) U.S. Cl.
CPC .............. *G11C 16/08* (2013.01); *G11C 15/04* (2013.01); *G11C 16/24* (2013.01); *G11C 16/30* (2013.01); *G11C 16/3404* (2013.01)

(58) Field of Classification Search
CPC ......... G11C 16/08; G11C 15/04; G11C 16/24; G11C 16/30; G11C 16/3404
USPC .................................................... 365/185.13
See application file for complete search history.

(56) References Cited

U.S. PATENT DOCUMENTS

| | | |
|---|---|---|
| 6,157,558 A | 12/2000 | Wong |
| 6,166,938 A | 12/2000 | Wong |
| 6,317,349 B1 | 11/2001 | Wong |
| 8,634,247 B1 | 1/2014 | Sprouse et al. |
| 8,634,248 B1 | 1/2014 | Sprouse et al. |
| 8,773,909 B2 | 7/2014 | Li et al. |
| 8,780,632 B2 | 7/2014 | Sprouse et al. |
| 8,780,633 B2 | 7/2014 | Sprouse et al. |
| 8,780,634 B2 | 7/2014 | Li et al. |
| 8,780,635 B2 | 7/2014 | Li et al. |
| 8,792,279 B2 | 7/2014 | Li et al. |
| 8,811,085 B2 | 8/2014 | Sprouse et al. |

(Continued)

OTHER PUBLICATIONS

Fedorov, Viacheslav V., et al. "FTCAM: An Area-Efficient Flash-Based Ternary CAM Design," IEEE Transactions on Computers, vol. 65, No. 8, Aug. 2016, 7 pages.

(Continued)

*Primary Examiner* — Hoai V Ho
*Assistant Examiner* — Minh Dinh
(74) *Attorney, Agent, or Firm* — SanDisk Technologies LLC

(57) ABSTRACT

Non-volatile memory structures are presented for a content addressable memory (CAM) that can perform in-memory search operations for both ternary and binary valued key values. Each ternary or binary valued key bit is stored in a pair of memory cells along a bit line of a NAND memory array, with the stored keys searched by applying each ternary or binary valued bit of an input key as voltage levels on a pair of word lines. The system is highly scalable. The system can also be used to perform nearest neighbor searches between stored vectors and an input vector to find stored vectors withing a specified Hamming distance of the input vector.

20 Claims, 21 Drawing Sheets

(56) References Cited

U.S. PATENT DOCUMENTS

| | | |
|---|---|---|
| 8,817,541 B2 | 8/2014 | Li et al. |
| 9,001,545 B2 | 4/2015 | Lee |
| 9,043,517 B1 | 5/2015 | Sprouse et al. |
| 9,098,403 B2 | 8/2015 | Sprouse et al. |
| 9,104,551 B2 | 8/2015 | Sprouse et al. |
| 9,116,796 B2 | 8/2015 | Sprouse et al. |
| 9,361,986 B2 | 6/2016 | Chen et al. |
| 9,384,126 B1 | 7/2016 | Sprouse et al. |
| 10,127,150 B2 | 11/2018 | Sprouse et al. |
| 10,622,072 B2 | 4/2020 | De Santis et al. |
| 10,811,058 B2 | 10/2020 | Zhang et al. |
| 2007/0058407 A1* | 3/2007 | Dosaka ............... G11C 15/04 365/189.15 |
| 2014/0133228 A1 | 5/2014 | Sprouse et al. |
| 2014/0133233 A1 | 5/2014 | Li et al. |
| 2014/0133237 A1 | 5/2014 | Sprouse et al. |
| 2014/0136756 A1 | 5/2014 | Sprouse et al. |
| 2014/0136757 A1 | 5/2014 | Sprouse et al. |
| 2014/0136758 A1 | 5/2014 | Sprouse et al. |
| 2014/0136759 A1 | 5/2014 | Sprouse et al. |
| 2014/0136760 A1 | 5/2014 | Sprouse et al. |
| 2014/0136761 A1 | 5/2014 | Li et al. |
| 2014/0136762 A1 | 5/2014 | Sprouse et al. |
| 2014/0136763 A1 | 5/2014 | Sprouse et al. |
| 2014/0136764 A1 | 5/2014 | Li et al. |
| 2015/0131383 A1 | 5/2015 | Akerib et al. |
| 2020/0395087 A1* | 12/2020 | Banerjee ............... G11C 16/14 |
| 2020/0411115 A1* | 12/2020 | Sakakibara ......... G11C 16/3427 |
| 2021/0202019 A1* | 7/2021 | Lee ..................... G11C 16/10 |

OTHER PUBLICATIONS

Lin, Zhiting, et al., "In-Memory Computing With Double Word Lines and Three Read Ports for Four Operands," IEEE Transactions on Very Large Scale Interaction (VLSI) Systems, vol. 28, No. 5, May 2020, 5 pages.

Tseng, Po-Hao, et al., "In-Memory-Searching Architecture Based on 3D-NAND Technology with Ultra-High Parallelism," IEEE International Electron Devices Meeting (IEDM), Dec. 2020, 4 pages.

Vyas, Shruti, et al., "TURBONFS: Turbo Nand Flash Search," GLSVLSI, May 2010, 6 pages.

\* cited by examiner

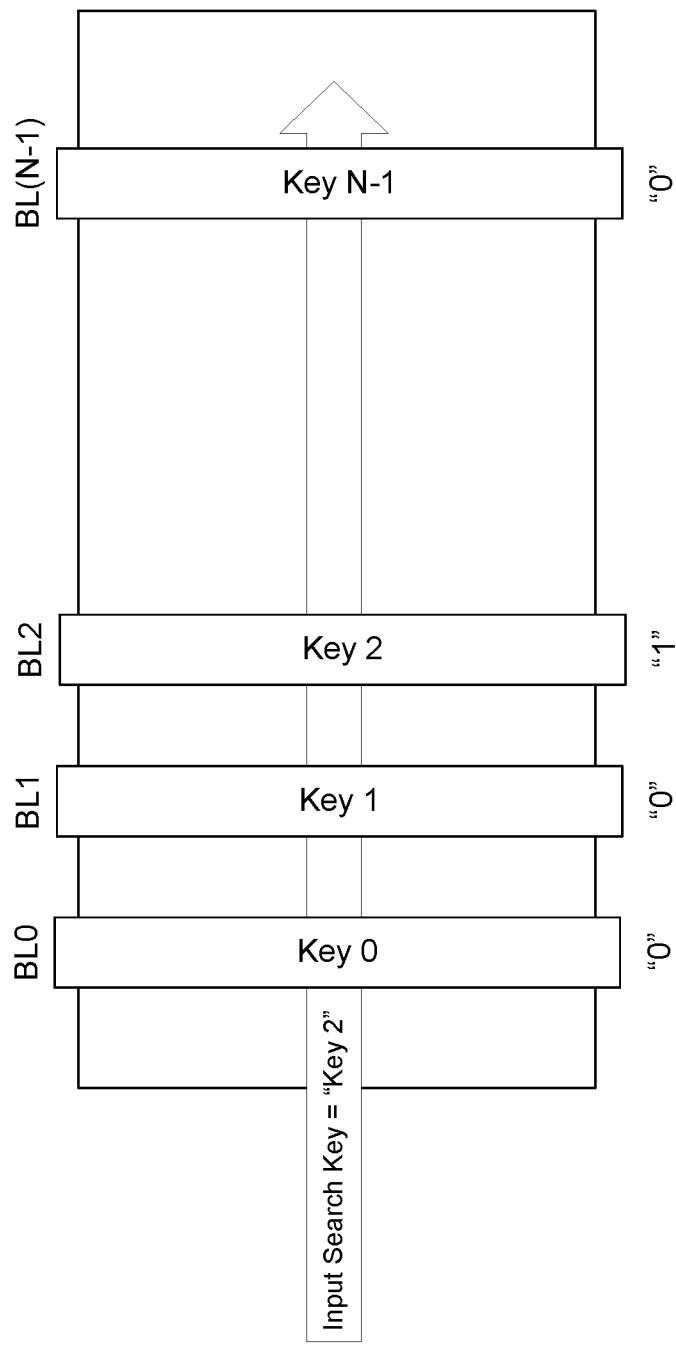

| Case | Input logic | Input voltage | | Key-bit logic | Key-bit Vth | | Output logic | Discharged current | Output voltage | Result |
|---|---|---|---|---|---|---|---|---|---|---|
| | | V1 | V2 | | FG1 | FG2 | | | | |
| | | "0" = Vread | "1" = Vpass | | "0" = V^HVT | "1" = V^LVT | | | | |
| 1 | 1 | 0 | 1 | 0 | 0 | 1 | 0 | x | No drop | Non-match |
| 2 | 0 | 1 | 0 | 1 | 1 | 0 | 0 | x | No drop | Non-match |
| 3 | 0 | 1 | 0 | 0 | 0 | 1 | 1 | Icell | ΔV drop | Match |
| 4 | 1 | 0 | 1 | 1 | 1 | 0 | 1 | Icell | ΔV drop | Match |
| 5 | x | 1 | 1 | 0 | 0 | 1 | -1 | Icell | ΔV drop | Match |
| 6 | x | 1 | 1 | 1 | 1 | 0 | 1 | Icell | ΔV drop | Match |
| 7 | 0 | 0 | 1 | x | 1 | 1 | -1 | Icell | ΔV drop | Match |
| 8 | 1 | 1 | 0 | x | 1 | 1 | 1 | Icell | ΔV drop | Match |
| 9 | x | 1 | 1 | x | 1 | 1 | 1 | Icell | ΔV drop | Match |

Figure 11

SCALABLE SEARCH SYSTEM DESIGN WITH SINGLE LEVEL CELL NAND-BASED BINARY AND TERNARY VALUED CONTENT ADDRESSABLE MEMORY CELLS

BACKGROUND

Content addressable memories, also known as associative memories, are different from standard memories in the way that data is addressed and retrieved. In a conventional memory, an address is supplied and the data located at this specified address is retrieved. In contrast, in a content addressable memory (CAM), data is written as a key-data pair. To retrieve the data, a search key is supplied and all the keys in the memory are searched for a match. If a match is found, the corresponding data is retrieved.

Content Addressable Memories, or CAMs, can be implemented in several ways. In one arrangement, a CAM is implemented using a conventional memory and an associated CPU which searches through the memory to find a matching key. The keys in the memory may be sorted, in which case a binary search can be used; or they can be unsorted, in which case they are usually hashed into buckets and each bucket is searched linearly. A CAM can also be implemented as a semiconductor memory, where every memory location contains an n-bit comparator. When an n-bit key is provided, each entry in the CAM will compare the search key with the entry's key, and signal a match if the two are equal.

BRIEF DESCRIPTION OF THE DRAWING

FIG. 7 illustrates the application of a search key to a NAND memory array storing keys along bit lines.

FIGS. 11 and 12 illustrate the mapping of a ternary CAM (TCAM) function onto dual SLC memory cells.

DETAILED DESCRIPTION

Searching is a critical task that is basic to many specific application domains such as genome sequencing, large scale key-value store systems, data analytics, identification, and other large data applications. In the era of big data, key size can be extremely large and not able to fit in on/off-chip memories, thus requiring a large SSD-back system for storing keys. However, the large key size generally limits the capability and applicability of conventional platforms such as CPU, GPU, FPGA, ASIC, or even in-flash controller computing for searching tasks, due to several drawbacks. One such drawback is a significant degradation of performance and energy efficiency when moving data back and forth across SSD storage bus structures to system components such as off-chip DRAM memory and on-chip memory, such as employed in, for example, a hierarchical cache or "scratch pad" memory. Additionally, searching throughput can be limited by the input/output bandwidth of an SSD storage system.

The following presents embodiments for scalable, high performance in-SSD storage searching systems that can accommodate large key sizes. Embodiments are based on single level cell (SLC) NAND memory that can support binary content addressable memory (BCAM) and ternary content addressable memory (TCAM) for exact and approximate searching, respectively. Within the NAND strings, each CAM cell is formed of two memory cells that can be programmed into a pair of entry values for an individual bit of a stored key and also into a third state to allow for ternary values in a stored key. Both the search key and the stored keys can then be implemented with ternary values.

Figure 1:
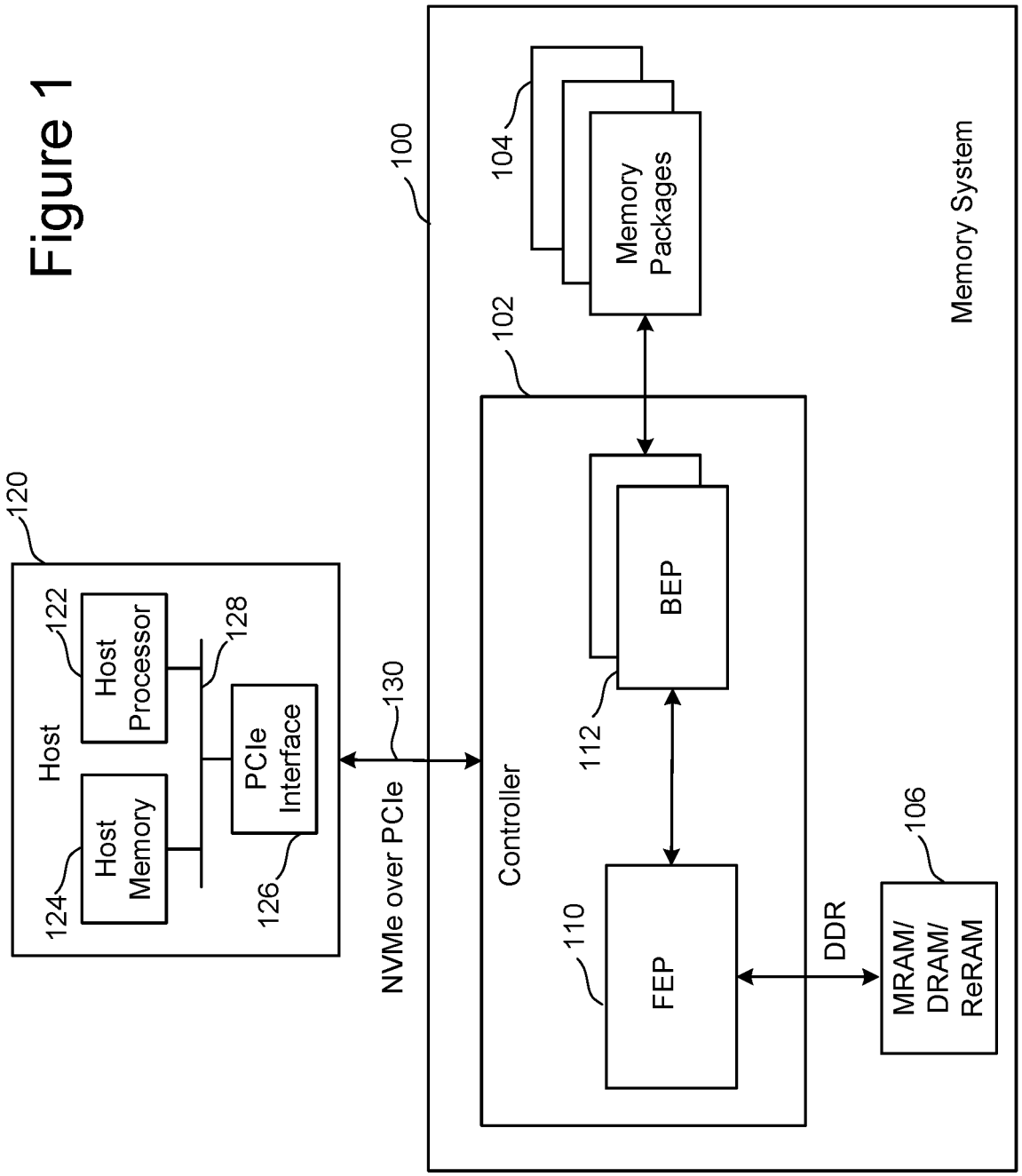
FIG. 1 is a block diagram of one embodiment of a memory system connected to a host.

FIG. 1 is a block diagram of one embodiment of a memory system 100 connected to a host 120. Memory system 100 can implement the technology proposed herein for implementing of binary/ternary valued content addressable memory. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g.., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM).

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
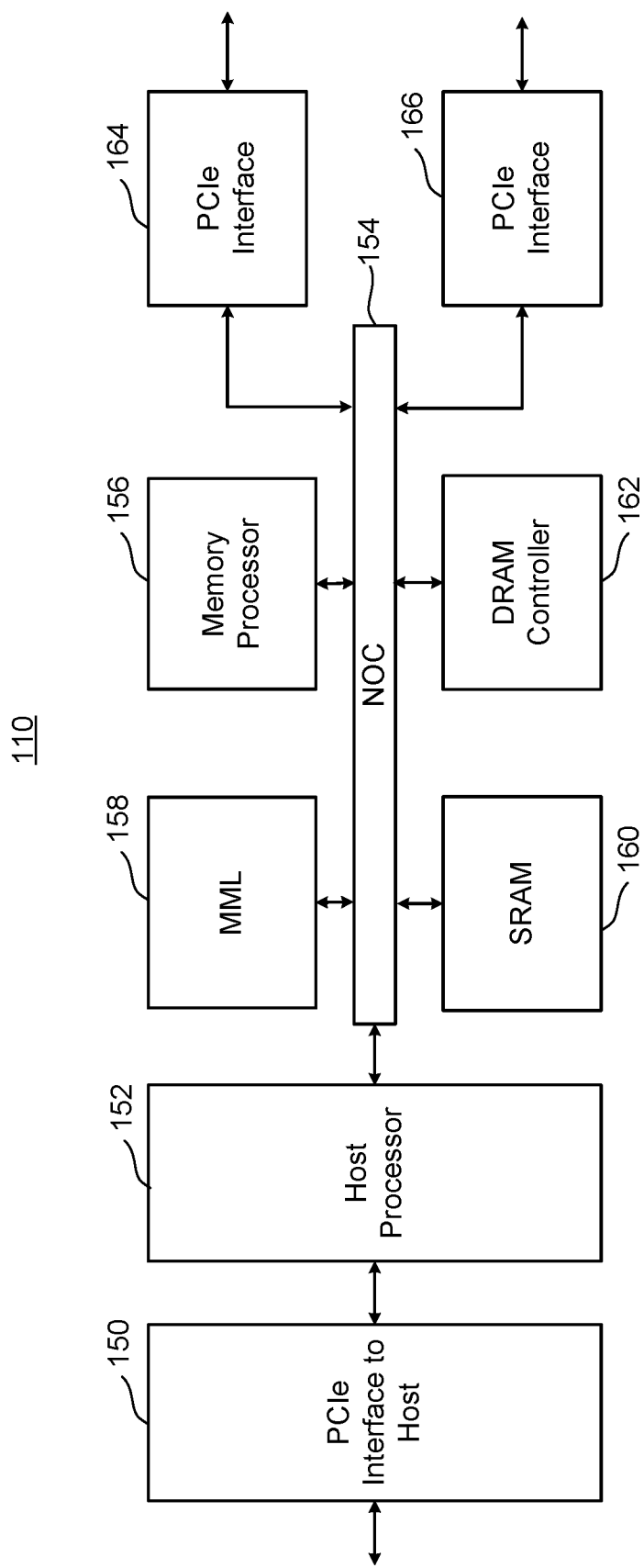
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
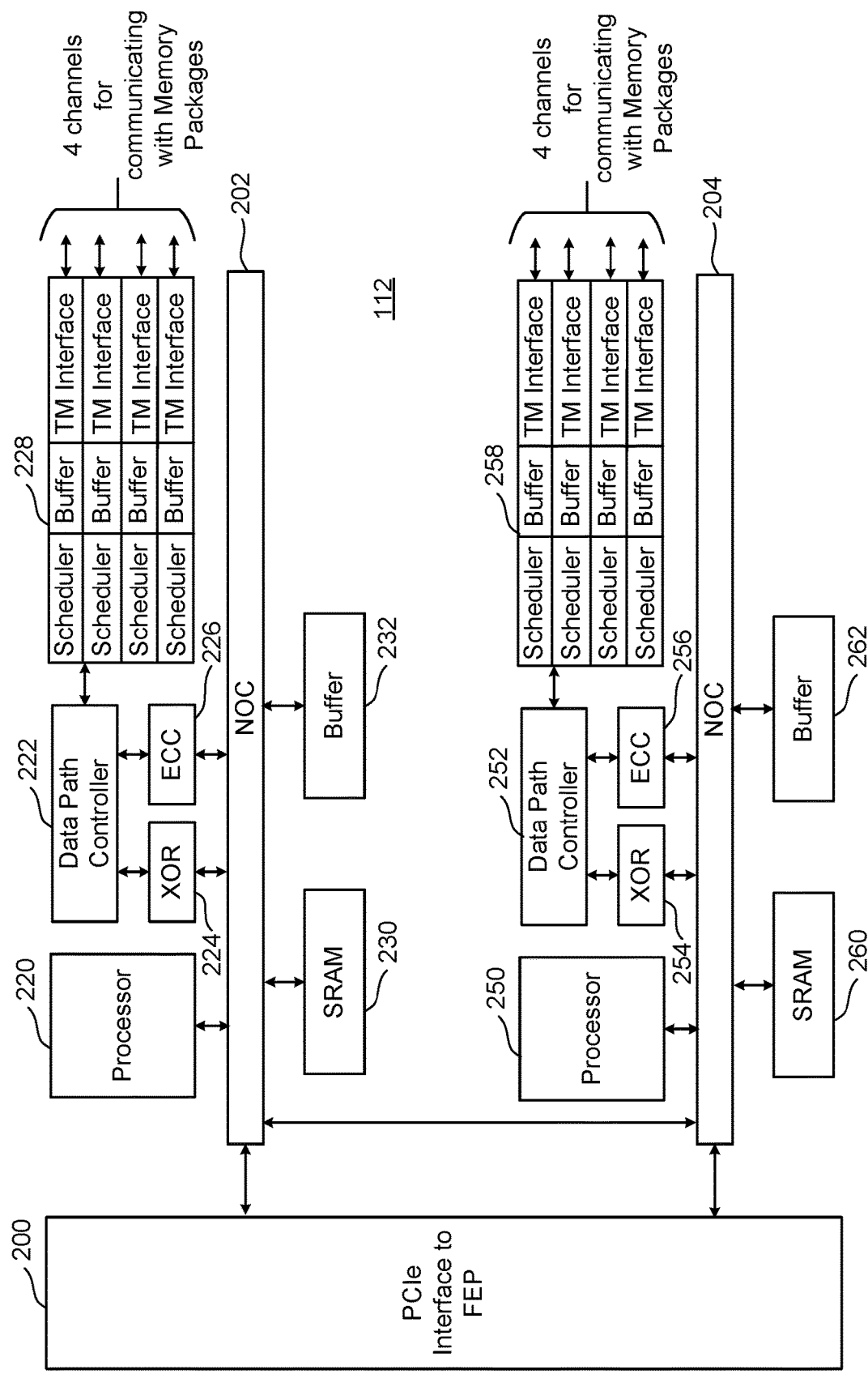
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
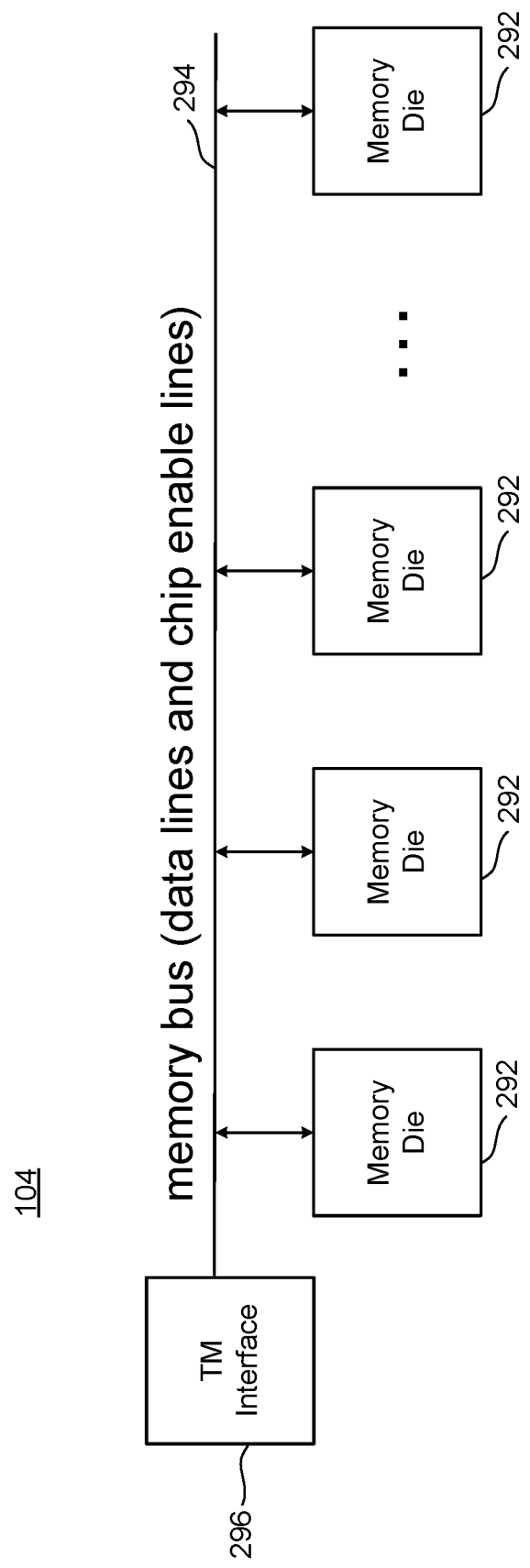
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
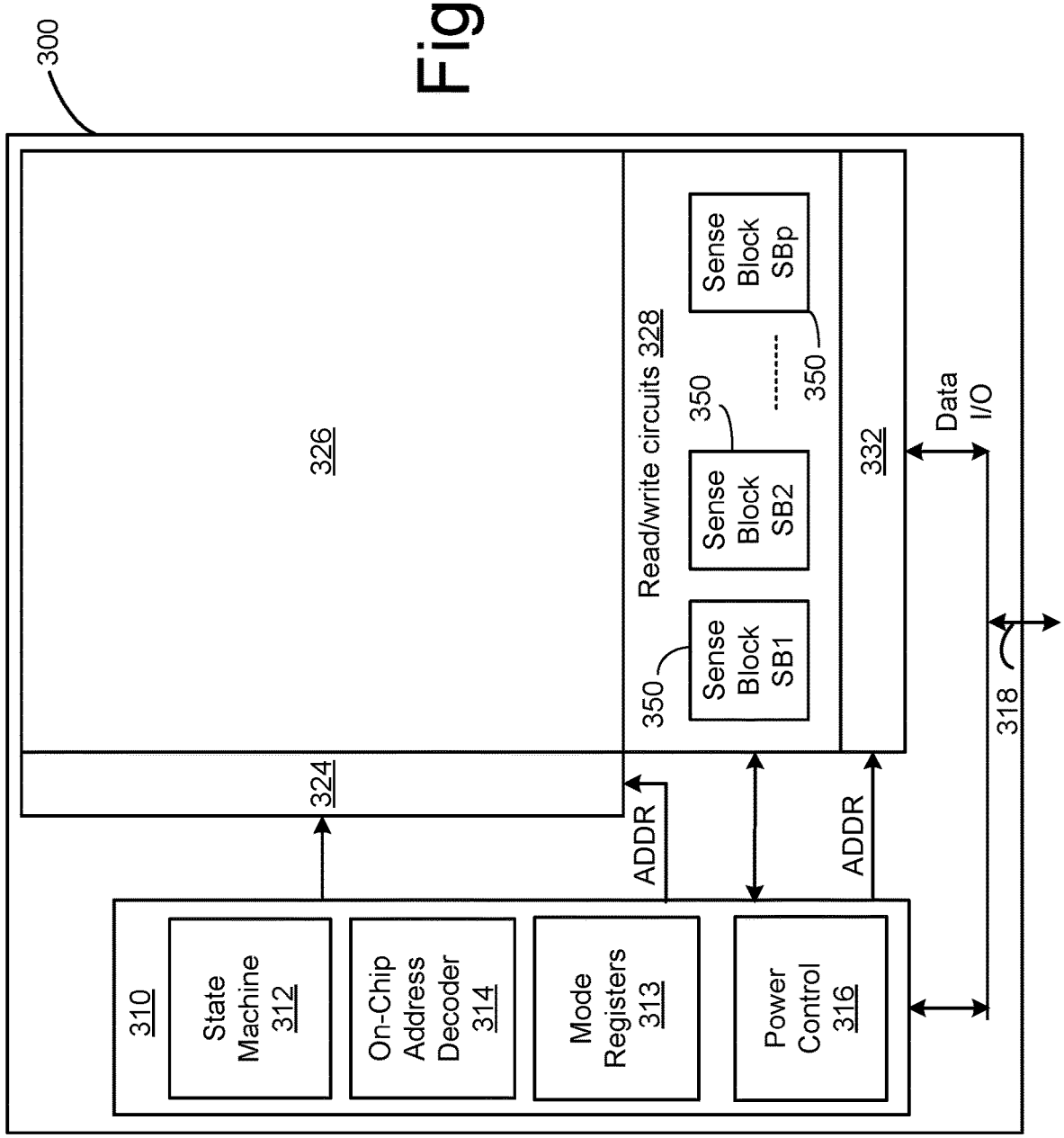
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters. The registers can include mode registers 313, which can include register values by which content addressable memory operations discussed below can be reconfigured to operate in either a binary mode or ternary mode.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can include a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the memory structure 326 of the memory cells and the peripheral circuitry, including all of the other elements. An important characteristic of a memory circuit is its capacity, which can be increased by increasing the area of the memory die 300 that is given over to the memory structure 326; however, this reduces the area of the memory die 300 available for the peripheral circuitry. This can place quite severe restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is the amount of area to devote to the memory structure 326 and the amount of area to devote to the peripheral circuitry.

Another area in which the memory structure 326 and the peripheral circuitry are often at odds is in the processing involved in forming these regions, since these regions often involve differing processing technologies and the trade-off in having differing technologies on a single die. For example, when the memory structure 326 is NAND flash, this is an NMOS structure, while the peripheral circuitry is often CMOS based. For example, sense amplifier circuits in the sense blocks 350, charge pumps in the power control block 316, logic elements in the state machine 312, and other peripheral circuitry often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
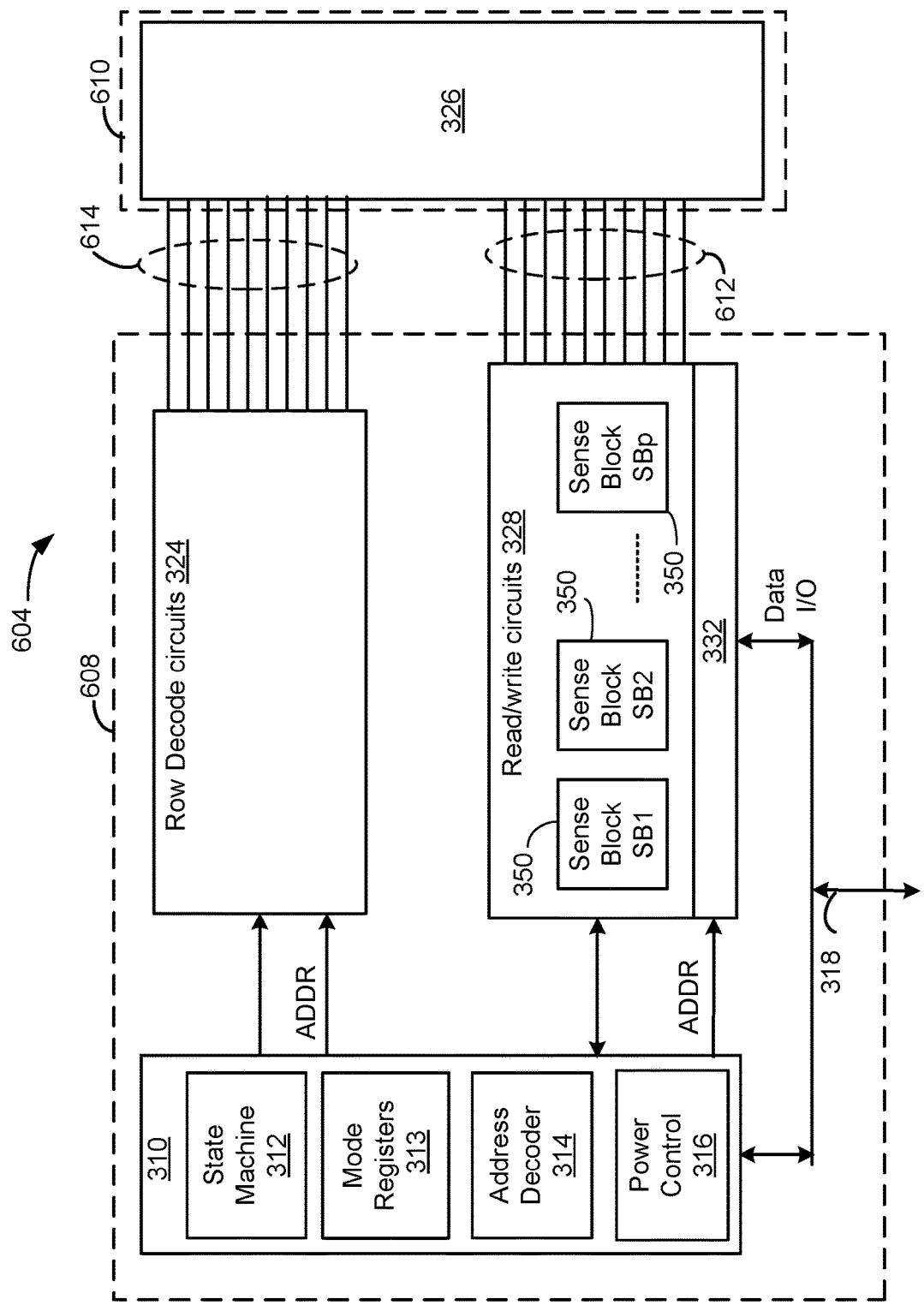
FIGS. 6A and 6B illustrates an example of control circuits coupled to a memory structure through wafer-to-wafer bonding.
Figure 6B:
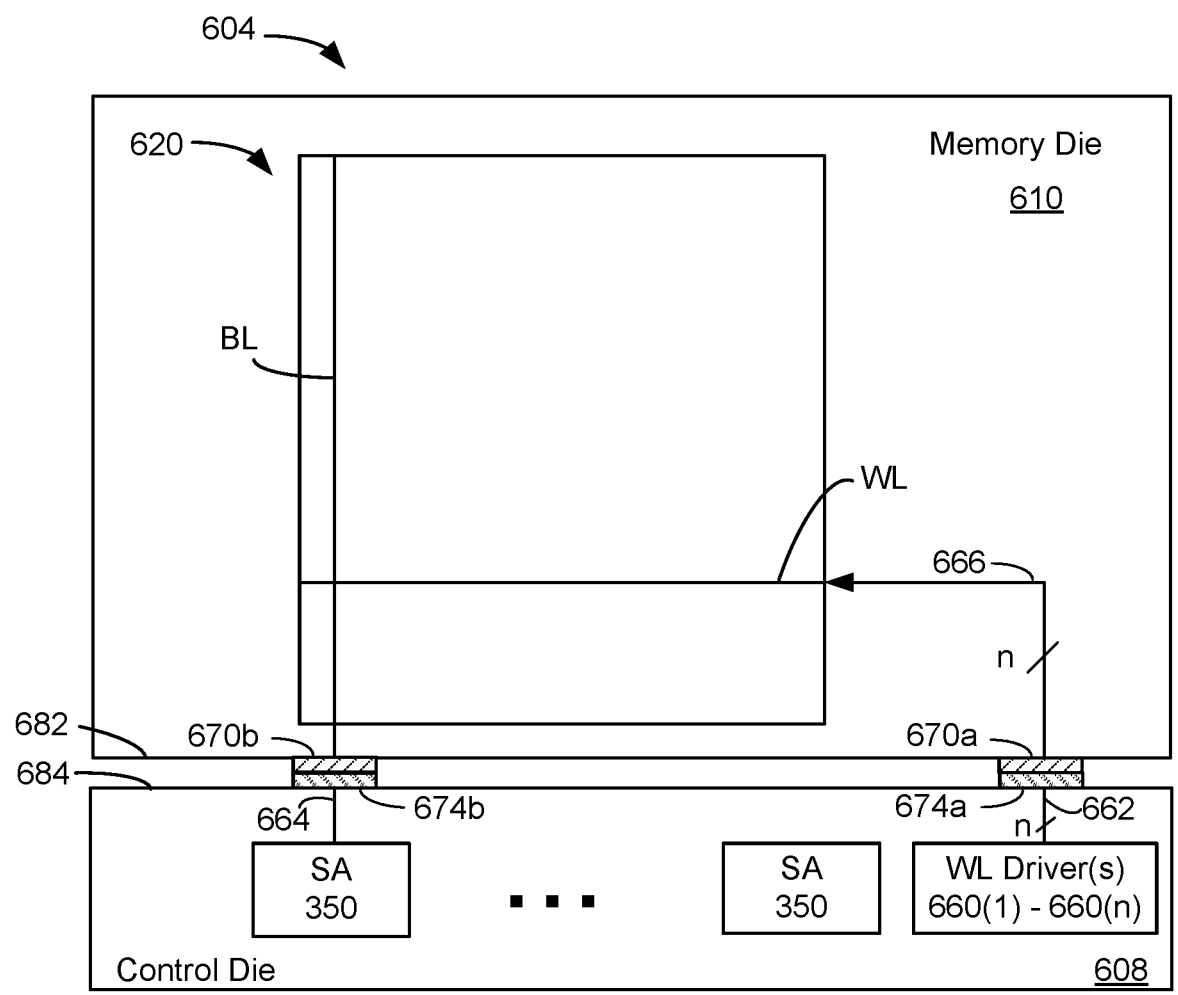

FIGS. 6A and 6B shows an alternative arrangement to that of FIG. 5, which may be implemented using wafer-to-wafer bonding to provide a bonded die pair 604. FIG. 6A shows an example of the peripheral circuitry, including control circuits, formed in a peripheral circuit or control die 608 coupled to memory structure 326 formed in memory die 610. Common components are numbered as in FIG. 5. It can be seen that control circuitry 310, read/write circuits 328, and row decoder 324 (which may be formed by a CMOS process) are located in control die 608. Additional elements, such as functionalities from controller 102 can also be moved into the control die 608. Control circuitry 310, read/write circuits 328, row decoder 324, and column decoder 332 may be formed by a common process (e.g., CMOS process), so that adding elements and functionalities more typically found on a memory controller 102 may require few or no additional process steps (i.e., the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 608 may not require any additional process steps.

FIG. 6A shows read/write circuits 328 on the control die 608 coupled to memory structure 326 on the memory die 610 through electrical paths 612. For example, electrical paths 612 may provide electrical connection between read/write circuits 328 and bit lines of memory structure 326. Electrical paths may extend from read/write circuits 328 in control die 608 through pads on control die 608 that are bonded to corresponding pads of the memory die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control die 608 and memory die 610.

FIG. 6B is a block diagram showing more detail on the arrangement of one embodiment of the integrated memory assembly of bonded die pair 604. Memory die 610 contains a plane 620 or array of memory cells. The memory die 610 may have additional planes or arrays. One representative bit line (BL) and representative word line (WL) is depicted for each plane or array 620. There may be thousands or tens of thousands of such bit lines per each plane or array 620. In one embodiment, an array or plane represents a groups of connected memory cells that share a common set of unbroken word lines and unbroken bit lines.

Control die 608 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line. The control die 608 includes a number of word line drivers **660(*l*)-660(*n*). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 (e.g., part of Power Control 316) provide voltages to the word lines in memory die 610. As discussed above with respect to FIG. 6A, the control die 608 may also include charge pumps, voltage generators, and the like that are not represented in FIG. 6B, which may be used to provide voltages for the word line drivers 660** and/or the bit line drivers.

The memory die 610 has a number of bond pads 670a, 670b on a first major surface 682 of memory die 610. There may be "n" bond pads 670a, to receive voltages from a corresponding "n" word line drivers **660(*l*)-660(*n*). There may be one bond pad 670b for each bit line associated with plane 620. The reference numeral 670 will be used to refer in general to bond pads on major surface 682**.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 604. For example, the data bus between the memory controller 102 and the integrated memory assembly 604 may, for example, provide for eight, sixteen, or perhaps 32 bits to be transferred in parallel. However, the data bus between the memory controller 102 and the integrated memory assembly 604 is not limited to these examples.

The control die 608 has a number of bond pads 674a, 674b on a first major surface 684 of control die 608. There may be "n" bond pads 674a, to deliver voltages from a corresponding "n" word line drivers **660(*l*)-660(*n*) to memory die 610. There may be one bond pad 674b for each bit line associated with plane 620. The reference numeral 674 will be used to refer in general to bond pads on major surface 682. Note that there may be bond pad pairs 670a/674a and bond pad pairs 670b/674b. In some embodiments, bond pads 670 and/or 674** are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 610 to the control die 608.

Also, the bond pads 670, 674 permit internal signal transfer between the memory die 610 and the control die 608. Thus, the memory die 610 and the control die 608 are bonded together with bond pads. Although FIG. 6A depicts one control die 608 bonded to one memory die 610, in another embodiment one control die 608 is bonded to multiple memory dies 610.

Herein, "internal signal transfer" means signal transfer between the control die 608 and the memory die 610. The internal signal transfer permits the circuitry on the control die 608 to control memory operations in the memory die 610. Therefore, the bond pads 670, 674 may be used for memory operation signal transfer. Herein, "memory operation signal transfer" refers to any signals that pertain to a memory operation in a memory die 610. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier 350 may be electrically connected to bond pad 674b by pathway 664. Relative to FIG. 6A, the electrical paths 612 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 614 can correspond to the pathway 662, the bond pads 674a, and bond pads 670a. Note that pathways 662 may comprise a separate conductive pathway for each word line driver **660(*l*)-660(*n*). Likewise, a there may be a separate bond pad 674a for each word line driver 660(*l*)-660(*n*). The word lines in block 2 of the memory die 610 may be electrically connected to bond pads 670a by pathways 664. In FIG. 6B, there are "n" pathways 664, for a corresponding "n" word lines in a block. There may be separate pair of bond pads 670a, 674a for each pathway 664**.

Relative to FIG. 5, the on-die control circuits of FIG. 6A can also include addition functionalities within its logic elements, both more general capabilities than are typically found in the memory controller 102 and some CPU capabilities, but also application specific features.

In the following, state machine 312 and/or controller 102 (or equivalently functioned circuits), in combination with all or a subset of the other circuits depicted on the control die 608 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

Turning now to types of data that can be stored in non-volatile memory devices, a particular example of the type of data of interest in the following discussion are key values for a content accessible memory. More specifically, the following presents structures and methods for using a memory array, such as flash based NAND memory, as a content addressable memory (CAM) that can be realized in embodiments where both the keys stored in the array and the search keys can be ternary valued. As described in more detail below, keys can be programmed along the bit lines of a block. The search key is then input along the word lines of the blocks, so that a bit line on which a matching input key has been programmed will be conducting. This allows for all the keys of a block to be checked at the same time.

The typical way by which a NAND memory array is read is that data is read out a single word line (or portion of a word line) at a time, with the non-selected word lines along the NAND strings being biased so that they are fully turned on regardless of the data state, removing the non-selected memory from affecting the read operation. In this way, the data content of the memory is read out a page (the unit of read) at a time. In contrast, to use a NAND flash memory as a content addressable memory, all of the word lines are set to a specific data dependent value, where the data is the input or search key, and the memory determines which bit lines then conduct, thereby determining particular bit lines correspond to the search key, rather that the data of individual memory cells.

In a binary, or single level cell (SLC), EEPROM based flash memory, in a write operation each cell is either left in an erased state or charge is placed on the memory cell's floating gate to put the cell in a programmed state, which here are respectively taken as the 1 and 0 states. When a low value for the read voltage is applied to its control gate, only a memory cell in the erased, or 1, state will conduct. For memory cells in the programmed, or 0, state, a high value of the read voltage needs to be applied to the control gate for a cell to conduct. The keys can be arranged along bit lines of blocks of the memory array. Since a cell in the 1 state will conduct for either read voltage, each key needs to be written twice, in inverted and non-inverted form. This can be done by writing the target key along one bit line and its inverse along another, or writing half the bit line with the (non-inverted) target key and the other half of the bit line with the inverted target key. More key info can be compressed into the NAND chain using multiple bits programming.

FIG. 7 illustrates the application of a search key to a NAND memory array storing keys along bit lines. The general concept can be illustrated by FIG. 1. Target keys Key 0, Key 1, . . . are programmed down bit lines BL0, BL1, . . . of a NAND block. Data corresponding to each of the keys are programmed in a separate location that can be indexed by the target key's column address number. To search the block for a key, the input search key is broadcasted on the block's word lines by setting all of the word lines according to either the high or low read voltage according to the search key. (In addition to setting the word line voltages according to the key, the select gates at the end of the NAND string will also need to be turned on.) Each bit line effectively compares itself to the word line key pattern for all of the bit lines in the block at the same time. If the bit line key matches the search key, the whole of the bit line will be conducting and a "1" will be read out. Once the column (bit line) index of the key is found, it can be used to fetch the corresponding data from another memory area, a "data" block. The key can be the hash code of the data page that will lead to the right data page by the column address of the matched NAND chain. For content matching applications, such as data compression or de-duplication, each 16 KB, say, of content can generate a corresponding hash code that can be stored along the NAND chain. If the key along the NAND chain is matched, then the data page will be compared with the comparing data along the word line to avoid hash collision cases. In other cases, the content along the word line may not be a hash value, but characteristics of the data elements that can be searched as a key to data; or the bits lines themselves main be the elements of the data themselves, rather than a pointer to a data base.

As discussed in more detail below, since a memory cell in either the 0 or 1 state will conduct for a high read voltage, the key will need to be entered twice, both non-inverted and inverted. This can be done by either programming the target key on two bit lines, reducing the number of keys by half, or programming both versions of the key on the same bit line, reducing the key size by half. However, given the size of available NAND blocks, even with these reductions the number of keys that can be checked in parallel is quite large. Relative to some other memory technologies, NAND flash memory has relatively large latencies in its operation, but in many applications this would more than be offset by the number of keys (bit lines) that can be checked in parallel. The process can all be done on-chip and, as only the bit lines that meet the matching case conducting current, with relatively low power consumption, so that compared to toggling out all of the data from the memory and doing the compare in the controller, it is a process of relatively low power and higher speed.

When writing in the keys, these will be typically written on a page by page basis, although in memories that allow it, partial page programming can be used to write part of the keys, with more added later. As one example, the data can be shifted on to the memory and the inverted data ("data bar") can be generated on the memory to save effort on the controller for these data manipulations, where the data and data bar can be written without shifting in the data twice, with the data being written first, and the generated inverse next. Both the keys and the data can be input into the memory system, or in some eases the keys could be generated on the memory system by the controller from the data, such as by generating hash values from the data to use as keys. If the keys are to be sorted before being written along the bit lines, this will typically be done on the controller due to the amount of data involved, such as multiple blocks' worth of data. For example, the data could initially be written in a particular area, say die 0, plane 0, blocks 0-15, and then sorted and written into the blocks having been sorted to the block level. Alternately, the keys could be assembled in RAM (either on the controller or on a separate chip) or cache NAND memory before sorting them to the desired level of granularity and writing them into a set of blocks.

As discussed further below, the data/data bar pairs can be written on two bits lines or on a single bit line. When the data/data bar pairs are written on two bit lines, the pairs can be written next to each other or in other patterns, such as writing the data bit lines in one area and the inverted data bit lines in another zone. When both parts of the pair on written on the same bit line, they can be written in a top/bottom format or interleaved. In the main embodiments discussed below, the data/data bar pairs are written so that each entry of a key value and its inverse are written into a pair of memory cells along the same bit line, so that a pair of memory cells form a CAM cell that, for example, can be formed on adjacent word lines. In this arrangement, where two memory cells form a single CAM cell, a bit line of 2N memory cells corresponds to N CAM cells and, similarly, the search key is entered as word line voltage pairs.

In a search by applying a search key to an array, the matched search key, or index, can then be linked to other data corresponding to the determined column address; for instance, the keys could be a hash value, such as from a Secure Hash Algorithm (SHA), used to point to the actual data that can also be stored elsewhere on the memory itself. All the matching can be done inside of the NAND chip and, when the match is found, the column address can also be transferred out if needed or just the data, if also stored on the NAND chip, can be transferred out.

To efficiently implement the use of a NAND array as a CAM memory, changes can be made to the word line driving circuitry. To broadcast a search key down the word lines of a block, in addition to turning on the select gates on either end of the NAND strings, each word line of the block needs to be set to either the high or low read voltage according to the search key. This is in contrast to typical NAND operation, where only a single word line at a time is selected for a read voltage, with all of the other word lines receiving a pass voltage sufficient to remove them from influencing the sensing regardless of their data state.

Figure 8:
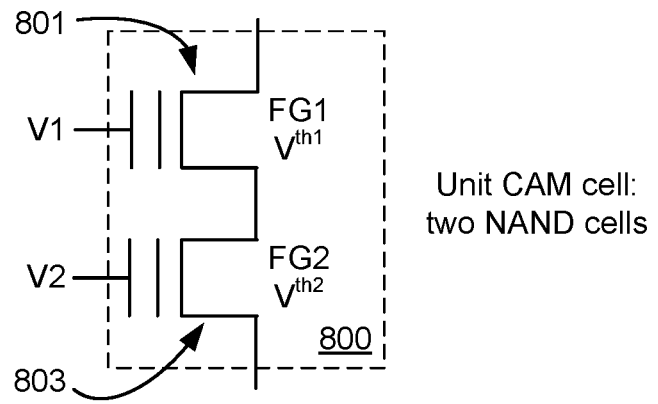
FIG. 8 illustrates an embodiment for a CAM cell formed of a pair of floating gate memory cells on a NAND string.

FIG. 8 illustrates an embodiment for a CAM cell 800 formed of a pair of floating gate memory cells on a NAND string. Only the two floating gate memory cells, upper (as represented in the figure) memory cell FG1 801 and lower memory cell FG2 803, of the NAND string are shown, but a typical NAND string will typically have a large number of such memory cells located between drain and source side select gates. Additionally, as represented in FIG. 8 and subsequent figures, the pair of memory cells FG1 801 and FG2 803 forming a CAM cell 800 are adjacent, but in an actual implementation they may alternately be arranged differently along a NAND string, such as by grouping the "upper" memory cells of the CAM cells along the NAND string together in one contiguous group and the "lower" memory cells of the pair in another contiguous group or in other arrangements. Each of memory cell FG1 801 and FG2 803 respectively has a respective threshold voltage $V^{th1}$ and $V^{th2}$ and has a control gate connected to receive a voltage V1 and V2 from the corresponding word line along which the memory cell is connected.

As arranged in FIG. 8, the serial connected SLC NAND memory cell pair of FG1 801 and FG2 803 can be used to construct a binary or ternary CAM cell 800, with input data is compared to the input search key and then comparison output are combined. The data content of the memory cell pair of CAM cell 800 can be programmed via the corresponding two word line voltages V1 and V2 as with a standard NAND memory cell. The dual word line voltages are programmed (biased) to encode input searched data by following values:

Read voltage ($V^{READ}$) refers to input bit "0"; and
Pass voltage ($V^{PASS}$) refers to input bit "1".

The threshold voltages (Vth) of the floating gate memory cells are programmed to encode the bit of a key by following values:

High threshold voltage ($V^{VHT}$) refers to key bit "0"; and
Low threshold voltage ($V^{LVT}$) refers to key bit "1".

Figure 9:
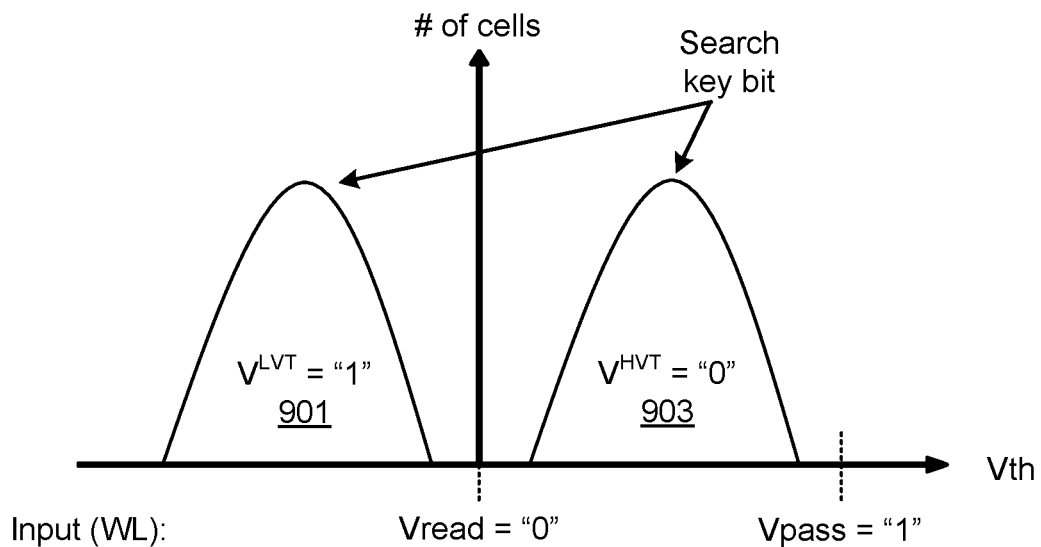
FIG. 9 shows a set of memory cells programmed into the distributions of SLC threshold values to illustrate the encoding of input and key values.

This is encoding is illustrated by FIG. 9.

FIG. 9 shows a set of memory cells programmed into the distributions of SLC threshold values to illustrate the encoding of input and key values. At left is a distribution of memory cells programmed to a low threshold voltage ($V^{LVT}$), corresponding to key bit "1". A memory cell in the $V^{LVT}$ state will conduct in response to either of $V^{READ}$ (corresponding to input bit "0") or $V^{PASS}$ (corresponding to input bit "1") being applied to its control gate, as these are both higher than the memory cell's threshold voltage. A memory cell in the $V^{HVT}$ state will conduct in response to $V^{PASS}$, but not either of $V^{READ}$ as $V^{READ}$ is a lower voltage value than the memory cell's threshold voltage.

Figure 10:
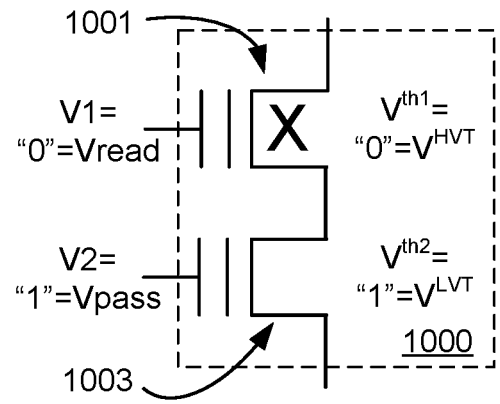
FIG. 10 illustrates an example of the operation of a two memory cell CAM cell, where an input bit "1" is compared with a search key bit "0".

FIG. 10 illustrates an example of the operation of a two memory cell CAM, where an input key bit "1" is compared with a stored key bit "0", where the CAM cell is composed of the memory cells FG1 1001 and FG2 1003 arranged as in FIG. 8. An input bit "1" is encoded by the word line voltage pair (V1, V2)=(0, 1), which will be programmed along the corresponding word lines with respect to ($V^{READ}$, $V^{PASS}$). For the key written in the NAND string, key bit "0" is encoded by the voltage threshold pair ($V^{th1}$, $V^{PASS}$)=(0, 1) as programmed with respect to ($V^{VHT}$, $V^{LVT}$). As the voltage applied ($V^{READ}$) to FG1 1001 is less than its threshold voltage ($V^{VHT}$), FG1 1001 will not conduct, so that is no current on the bit line due to the non-match the input key bit "1" not matching the stored key bit "0". If, instead, the input values where switched to "0" value for the input key value (the word line voltage pair (V1, V2)=(1, 0), there will be match and both memory cells of the CAM cell 1000 will conduct.

Figure 12:
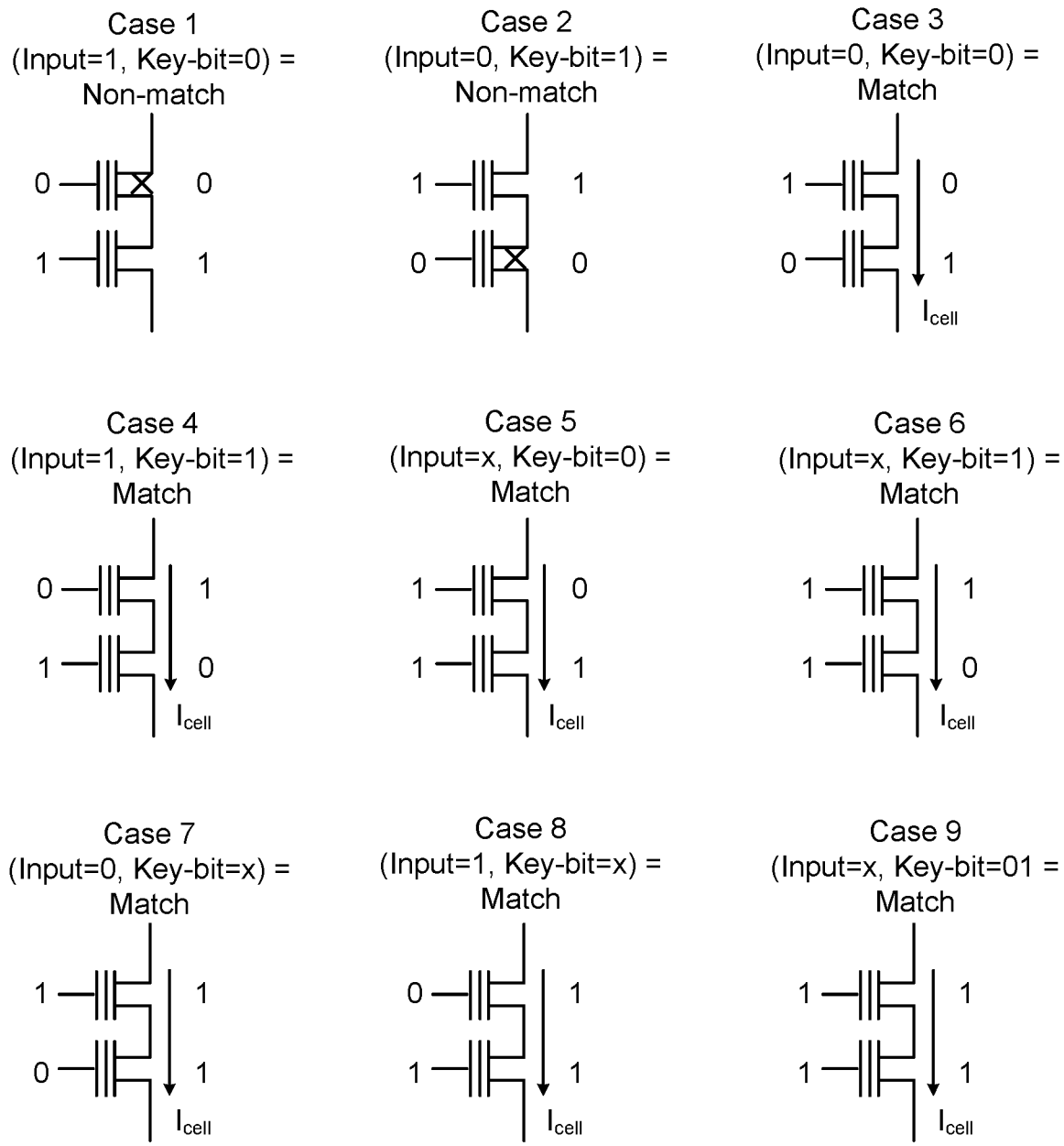

FIGS. 11 and 12 illustrate the mapping of a ternary CAM (TCAM) function onto dual SLC NAND memory cells, where FIG. 11 is a truth table of programmed word line voltages and NAND states for TCAM function and FIG. 12 represents the different cases in terms of the CAM cells. For ternary input values the input logic values are (1, 0, x) and for ternary stored values the key-bit logic the values are also (1, 0, x), for a total of 9 different cases. In the truth table of FIG. 11, these cases are listed in the left-most column, followed by the input logic level and how these translate into the voltages applied to the control gates of a CAM cell, followed by the stored key-bit logic values and how these translate into threshold voltages of the memory cells in the CAM cell, and which is followed in turn by the output logic values and how these correspond to discharged current, output voltage, and result.

As rearranged in FIG. 11, cases 1-4 correspond to the binary values of the CAM cell, followed by the "x" input logic values of cases 5 and 6 and the "x" stored key-bit values of cases 7-9. For the binary values, the input logic state 1 corresponds to (0, 1), corresponding to ($V^{READ}$, $V^{PASS}$), applied as (V1, V2) to the control gates of the memory cell pair; and logic state 0 corresponds to (1, 0), corresponding to ($V^{PASS}$, $V^{READ}$), applied as (V1, V2) to the control gates memory cell pair. For the binary key-bit values stored in the memory cell pair, a 0 logic value corresponds to ($V^{th1}$, $V^{th2}$)=(1,0)=($V^{LVT}$, $V^{HVT}$) as programmed into respective floating gates FG1 of the upper (as represented in the figures) and lower memory cell; and a 1 logic value corresponds to ($V^{th1}$, $V^{th2}$)=(1,0)=($V^{LVT}$, $V^{HVT}$). When the input bit value and the stored key-bit values match, as in cases 3 and 4, the output logic is 1, and when the input bit value and the stored key-bit values do not match, as in cases 1 and 2, the output logic is 0. These are represented in schematically in terms of the memory cell pairs in FIG. 12 by cases 1-4.

In FIG. 12, the non-conducting combinations are represented by X in the channel of the non-conducting memory cell. As shown in the non-match cases 1 and 2, one of the pair of memory cells is non-conducting and there will be no current through the memory cell pair of the CAM cell and no voltage dropped across the cell. In matching cases 3 and 4, both of the memory cells are on and the cells are conductive, passing a current Icell and there will be a ΔV voltage drop. (It should be noted that this is just looking at a single dual memory cell CAM cell, of which there will typically be many along a NAND string, so that a NAND string will only be conducting if all of the CAM cells along the string have a conducting (output logic 1) match result.

Returning to FIG. 11, cases 5 and 6 correspond to an input logic value of x, which is implemented as (V1, V2)=(1, 1)=($V^{Pass}$, $V^{PASS}$). This results in an output logic value of 1 as both memory cells of the CAM cell pair being in a conductive state regardless of the key-bit logic state to which the CAM cell has been programmed. As represented for cases 5 and 6 in FIG. 12, this results in a current of Icell through the CAM cell for both the 0 and 1 state for the key-bit logic values.

Cases 7-9 correspond to when to a stored key-bit logic value of x for respective input logic values (0, 1, x). For a key-bit logic value of x, $(V^{th1}, V^{th2})=(1,0)=(V^{LVT}, V^{HVT})$ the output logic is 1 for any of the ternary valued input logic values. As represented for the corresponding cases in FIG. 12, both memory cells of a CAM pair are on and passing a current Icell. Consequently, as illustrated in FIGS. 11 and 12, a NAND-based TCAM function is fully supported by programming NAND states and their word lines different to corresponding values shown in the true table, where the match/non-match decision is achieved by sensing a voltage drop or cell current (Icell) existing on the corresponding bit line.

The structure of FIG. 11 readily allows for the mapping of a binary CAM (BCAM) functionality onto the dual SLC NAND memory used for the ternary functionality. Since BCAM (cases 1-4 of FIGS. 11 and 12) is a sub-set of TCAM (cases 1-9), it can be straightforward to configure a TCAM cell to provide a BCAM function. The BCAM function can be supported without modifying the NAND-based TCAM cell by not programming the word line voltage pairs of cell states to the BCAM forbidden x states of cases 5-9.

Figure 13:
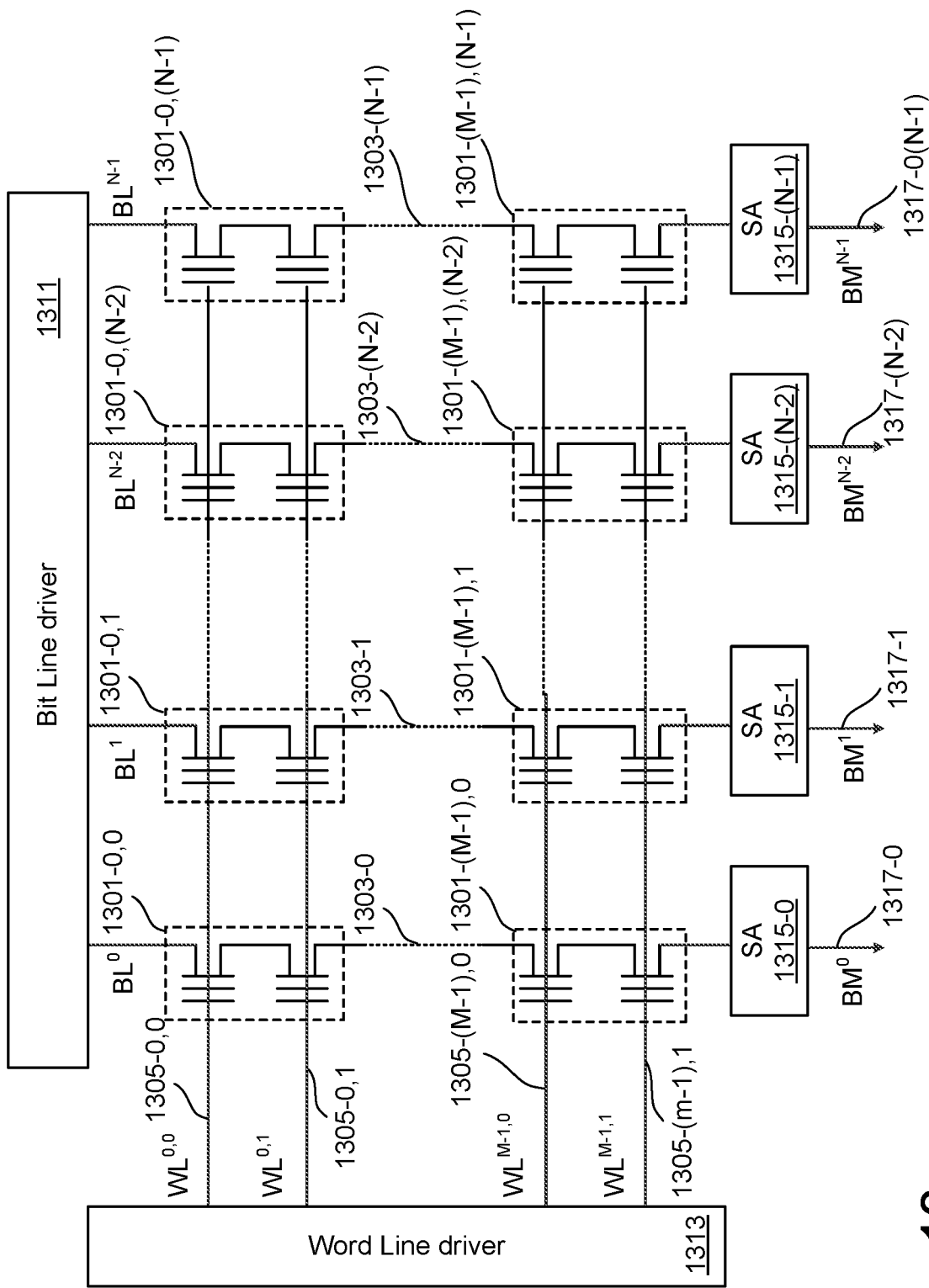
FIG. 13 illustrates an embodiment of an SLC NAND-based BCAM/TCAM block architecture.

FIG. 13 illustrates an embodiment of an SLC NAND-based BCAM/TCAM block architecture. FIG. 13 shows an array of SLC floating gate memory cells connected along bit lines in a NAND architecture with control gates connected along word lines. In this example, N bit lines $BL^j$ 1303-j for j=1, . . . , (N-1), and 2M word lines formed into M pairs $(WL^{i,0}, WL^{i,1})$ (1305-i,0, 1305-i,1) for i=1, . . . , (M-1)), The 2MxN memory cells are formed as pairs into of MxN BCAM/TCAM cells 1301-ij on word line pair $(WL^{i,0}, WL^{i,1})$ (1305-i,0, 1305-i,1) and bit line BL/1303-j. The BCAM/TCAM functionality can be flexibly reconfigured at the block level, such as by way register values stored, for example, in the mode registers 313 of FIG. 5 or 6A. (In an actual device, drain and source side select gates will include on respective ends of each of the NAND strings that will need to be turned on when checking for a match, but these not shown to simplify the discussion.)

The voltage levels are applied to the word lines by the word line driver 1313, which can be part of the row decode circuitry 324 of FIG. 5 or 6A. The bit lines are connected between the bit line driver 1311, which can be part of the read/write circuits and column decoder 332 circuitry, and the sense amplifiers SA 1315-j, which can be part of the sense blocks 350. As the sense amplifiers SA 1315-j can be single bit, they have a low hardware overhead. The output of sense amplifiers SA 1315-j is supplied along a block matching line BM/ 1317-j, that will indicate whether key stored along the corresponding bit line matches the input key applied by the word line driver 1313. FIG. 13 does not show circuitry to handle matched keys as this is a flexible design choice, where the matched key indices can be stored on/off-die SRAM buffer, or another NAND array for a subsequent processing, for example.

In a program phase, the keys are written in the memory cells and can be programmed in to the SLC memory cells using the conventional programming approach applied to device's memory cell technology. For example, a series of programming pulses having a staircase waveform alternated with verify operations in the case of a floating gate memory cell, with the programming pluses applied by the word line driver 1313 to the word lines with multiple bit lines (and match lines 1317-j) pre-charged by the sense amplifiers SA 1315-j.

During a search phase, the word line driver 1313 operates to provide a CAM mode, which differs from a typical read operation (in which only a single word line is read at a time) as multiple word lines are sensed concurrently with word line voltage pairs (corresponding to bit of the input key for the search) generated and applied to the word line pairs $(WL^{i,0}, WL^{i,1})$(1305-i,0, 1305-i,1) for two floating gates of the BCAM/TCAM cells 1305-i/ along the word line pair. When the CAM mode is disabled, the CAM block can function as a generic SLC NAND-based array, allowing for versatility of the memory device. In the read out phase, the match/non-match indication of the individual match lines 1317-j can be read out from the corresponding sense amplifier 1315-j. As SLC memory cells tend to be highly reliable (i.e., having a low bit error rate), this can relax the need of reading keys to the controller for ECC, which would significantly increase the energy consumption and delay of searching.

Figure 14:
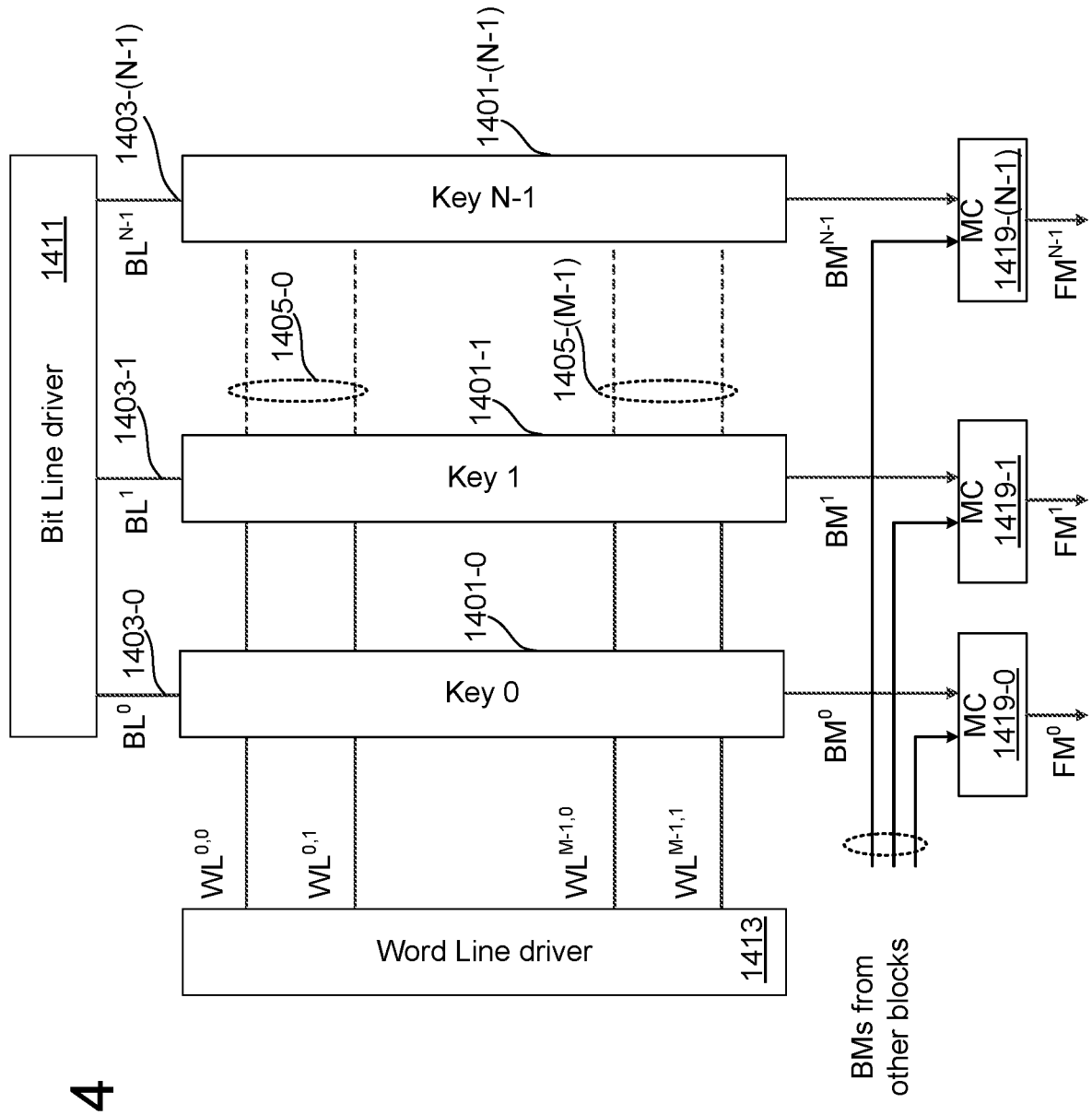
FIG. 14 illustrates the mapping of relatively short key values into a single NAND based BCAM/TCAM block.

FIG. 14 illustrates the mapping of relatively short key values into a single NAND based BCAM/TCAM block. Similar to FIG. 13, the bits of a key value are stored along bit lines, but now, rather the represent the individual CAM cells, the key j is shown along bit line $BL^j$ 1403-j that is connected to the bit line driver 1411, where the sense amplifiers are not shown to simplify FIG. 14. The word lines are grouped in pairs $(WL^{j,0}, WL^{i,1})$ 1405-i that are biased by the word line driver 1413. The keys stored in the example of FIG. 14 are relatively short, in that a key can fit onto a single NAND string, where architectures that support longer keys are discussed in following figures.

In the example of FIG. 14, full keys are stored in bit lines in a column-mapped arrangement. Much as described above with respect to FIG. 7, in a search, multiple bit lines can be activated in parallel to search multiple stored keys concurrently. The key value for the search is then input by applying the input key bit-values to the word line pairs, programming (biasing) them for a read out. Once the word line pairs are programmed, the matching decision for the whole keys are presented on the corresponding match lines $BM^j$. If multiple block are being used, match line values for the bit lines of the other block can be supplied to a corresponding matching combined circuit MC 1419-i for each bit line $BL^j$ 1403-j.

Figure 15A:
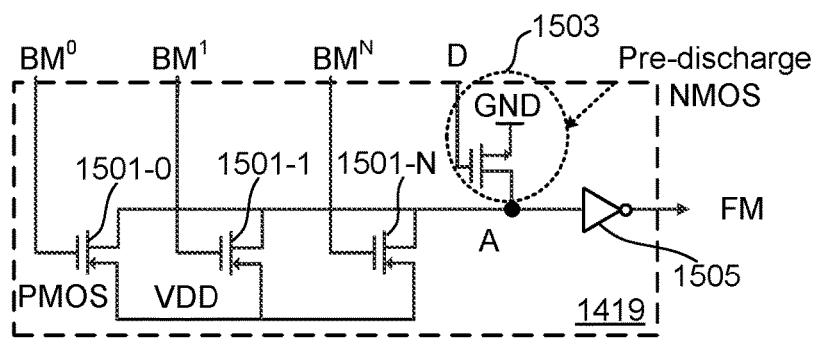
FIGS. 15A and 15B illustrate embodiments for the matching combined circuit of FIG. 14.
Figure 15B:
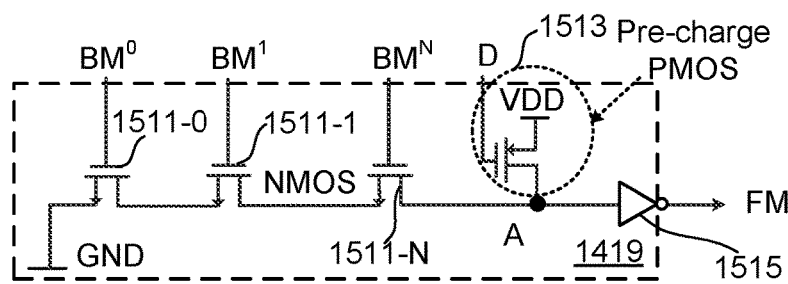

FIGS. 15A and 15B illustrate two embodiments for the matching combined circuit MC 1419-i of FIG. 14. FIG. 15A illustrates an OR-based embodiment. In a discharge phase, the node D is set by HIGH, pre-discharge NMOS 1503 is in ON-state, the node A is discharged to LOW, the final matching (FM) output from inverter 1505 is "don't care" during the pre-discharge phase. After node A is fully discharged (LOW), node D is set to LOW (NMOS 1503 changes to OFF-state) and node A becomes floating. During the search phase, if one of the BM values is LOW (one of blocks indicates non-matching), its corresponding PMOS 1501-j is in ON-state, node A keeps charging to HIGH, FM is de-asserted to LOW (via inverter 1505) indicating non-matching. If all of BM values are high (all blocks indicate matching), all PMOS 1501-j are OFF, node A stays at LOW, and FM is asserted to HIGH indicating all blocks matching.

FIG. 15B illustrates an AND-based embodiment. In a charge phase, node D is set by LOW, pre-charge PMOS 1513 is in an ON state, node A is charged to HIGH, and the final matching (FM) output from inverter 1515 is "don't care" during the pre-charge phase. After node A is fully charged (HIGH), node D is set to HIGH (PMOS 1513 changes to OFF-state), and node A becomes floating. During the search phase, if one of BM values s is LOW (one of block indicates non-matching), its corresponding NMOS 1511-j is in an OFF state, node A stays at HIGH, and FM is de-asserted (via inverter 1515) to LOW indicating non-matching. If all of BM values are HIGH (all blocks indicate matching), all NMOS 1515-j are in an ON state, node A is discharged to LOW, and FM is asserted to HIGH indicating all blocks matching.

The AND-based embodiment of FIG. 15B has a relative disadvantage compared to the OR-based embodiment of FIG. 15A, in that when an NMOS 1511-j is in the ON state (BM =HIGH), the supply voltage is dropped in the NMOS by threshold voltage of NMOS transistor ($V_{DD}$-$V_{th\_NMOS}$). Therefore, if the number of NMOS is high (and/or VDD is not sufficiently high), the NMOSs (e.g., 1511-N) closest to node A might not be fully turned ON even though their BM values are at HIGH. This can result in the A node not being fully discharged and FM keeps staying LOW, indicating incorrect non-matching, even when all BM values are HIGH (all block matching).

Figure 17:
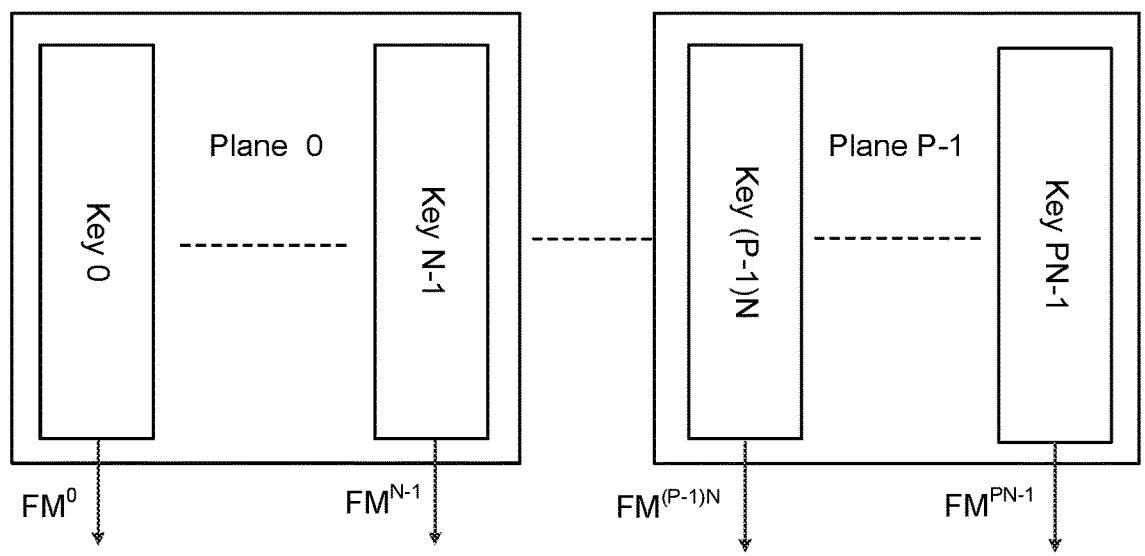
FIGS. 16 and 17 illustrate a pair of embodiments for mapping longer key values across multiple NAND-based BCAM/TCAM blocks of a memory die to illustrate the scalability of the approach presented here.
Figure 16:
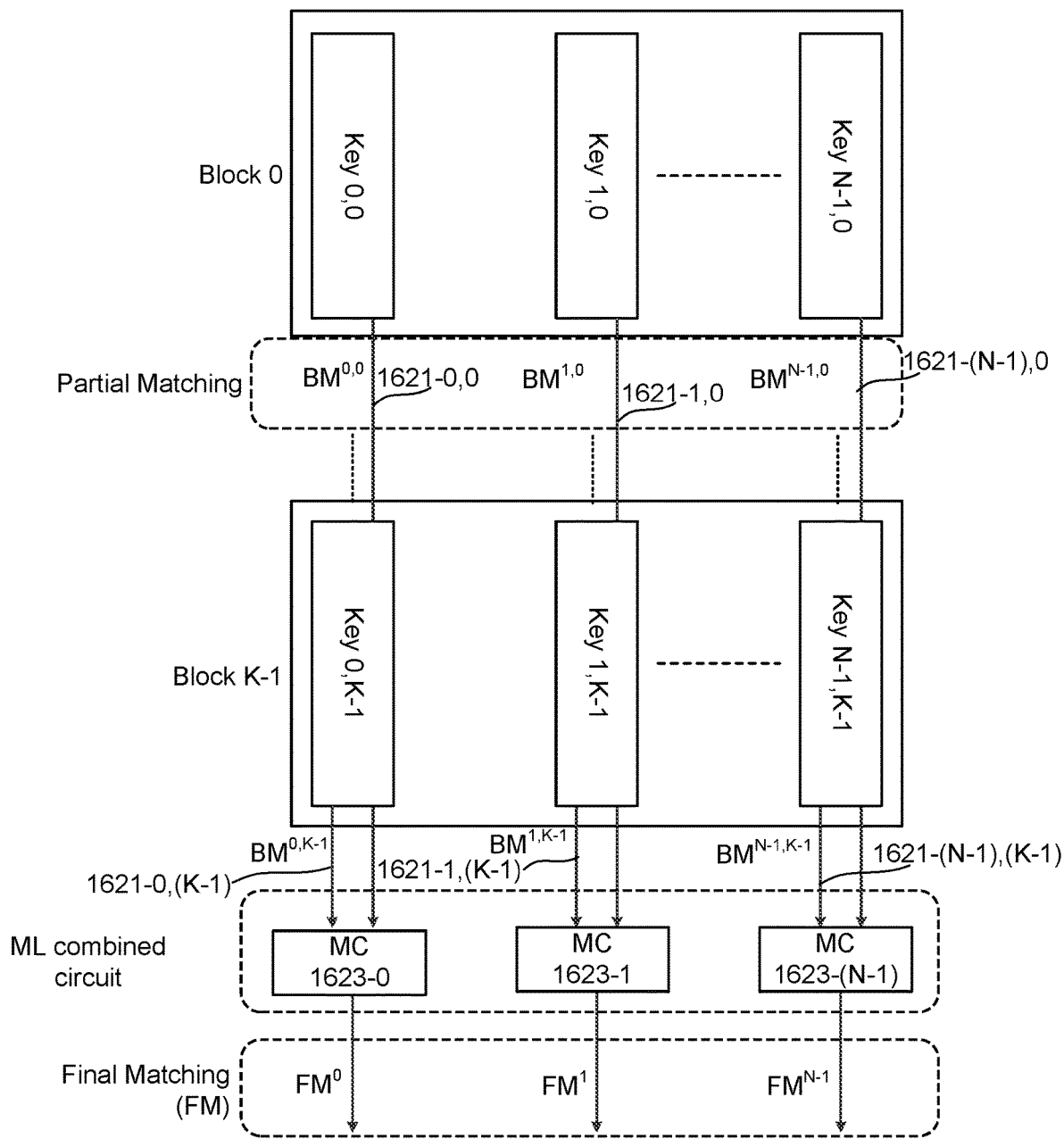

FIGS. 16 and 17 illustrate a pair of embodiments for mapping longer key values across multiple NAND-based BCAM/TCAM blocks of a memory die or dies to illustrate the scalability of the approach presented here. The arrangement of FIG. 16 can support very long search keys by mapping sub-keys across multiple NAND blocks running in parallel, and then combining the block matching lines (partial matching). A single long search key, Key j, is divided into K short (i.e., the length of a single NAND string) sub-keys Key j,k of the same length and mapped onto K NAND-based blocks. The block matching lines ($BM^{j,k}$ 1621-j,k) from each of the blocks are combined using ML combined circuit 1623-j along each column for the final matching (FM) decision.

The arrangement of FIG. 17 illustrates an embodiment that can support large key size by leveraging parallelism across NAND blocks and planes. In FIG. 17 a large number of keys are mapped across P NAND planes of N word lines each, for a total of NxP key (or sub-keys).

Within a plane, a long search key can be supported by leveraging multiple blocks, each block implemented as described above with respect to FIG. 14. The arrangements of FIGS. 16 and 17 allow for the memory system to support both large key size and long search keys by leveraging parallelism across block and plane levels to achieve high throughput, with the system performance of NAND-based BCAM/TCAM scaling well with the key size and key length.

Figure 18:
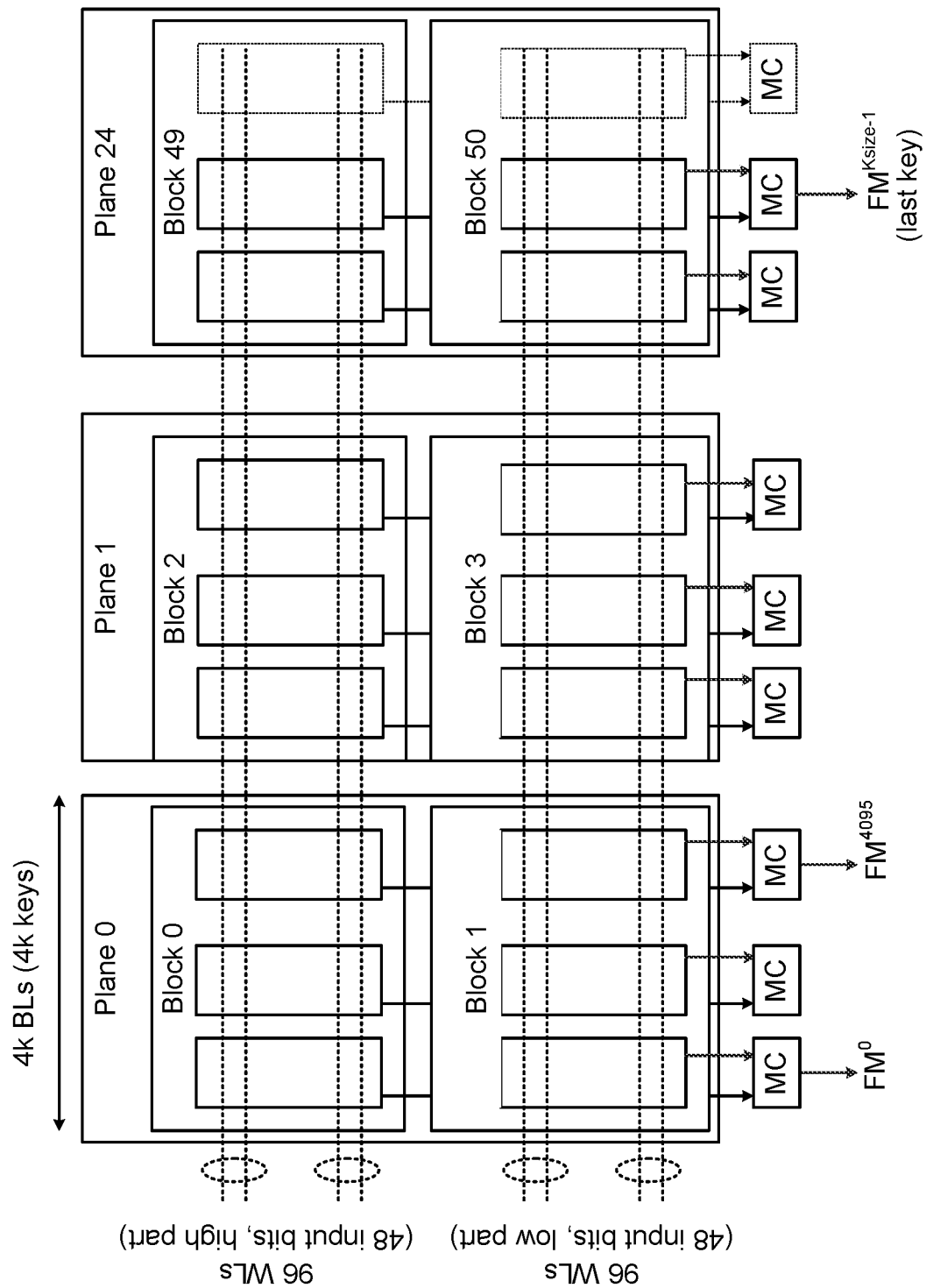
FIGS. 18 and 19 consider the application of an SLC NAND-based BCM/TCM memory array to the specific application of accelerating genome sequencing for short and long keys.
Figure 19:
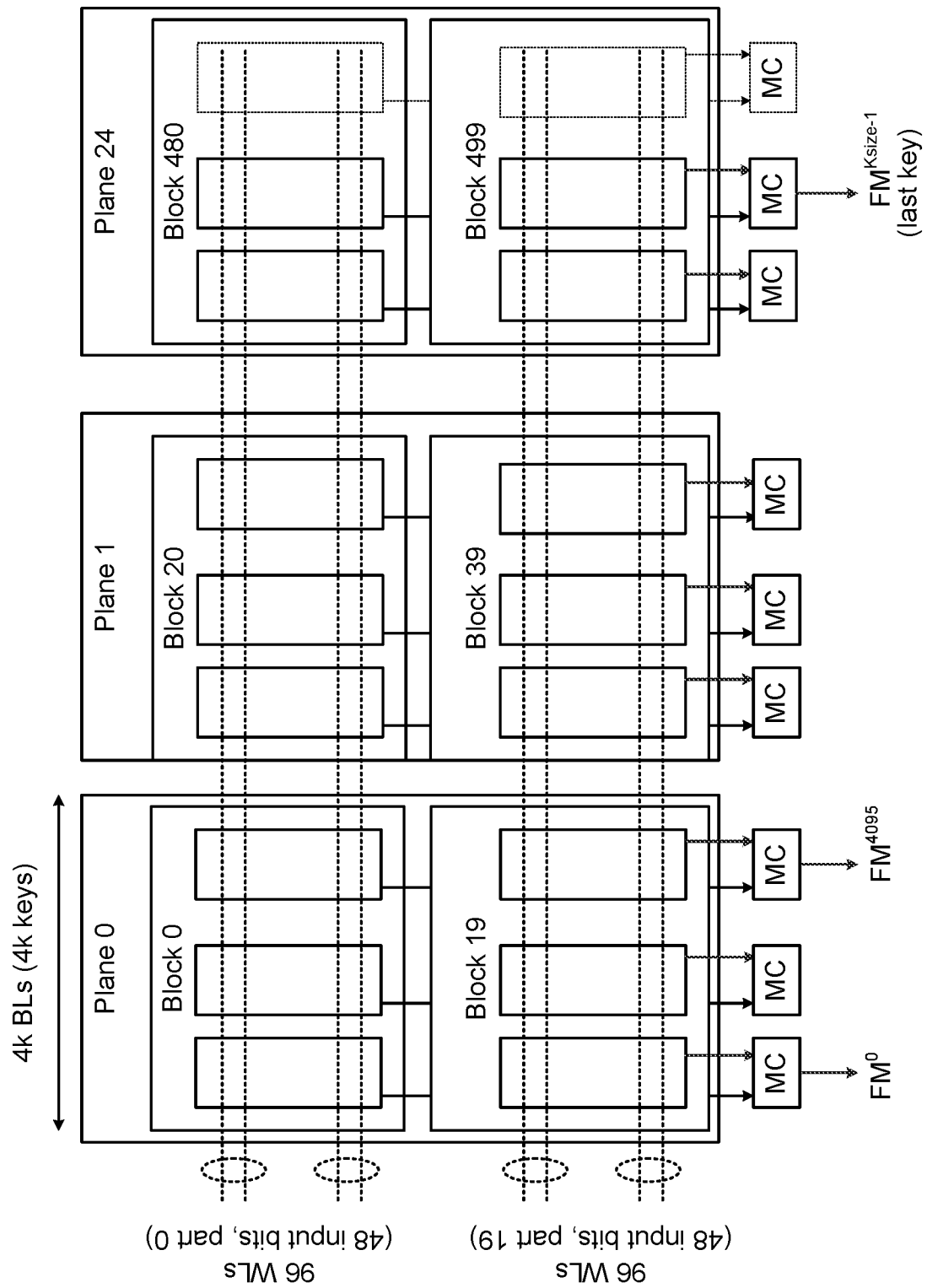

FIGS. 18 and 19 consider the use of an SLC NAND-based BCM/TCM memory array to the specific application of accelerating genome sequencing for short and long keys. FIG. 18 looks at the example of short keys (96 bits each) where there are $10^5$ such keys to be searched by an input key to look for matches. In this example, the NAND block is taken to have 4096 bit lines and 96 word lines. As the CAM cell is made of a pair memory cells, the word lines are also paired, so that a single block can store 48 bits for a given key on each bit line of a block. Consequently, a single 96-bit key can be stored in the bit lines of two combined blocks from a single plane, where for a match for the final match FM value of bit line the matching combined circuit MC will signal a match if there is a match in both the upper part and the lower part of the key. Therefore, a single plane can provide searching over 4096 keys in parallel. For storing $10^5$ such keys, the number of planes is 25, for a total of 50 blocks, where the last plane (Plane 24) is partially mapped (using 1696 of 4096 bit lines). By activating the 50 blocks concurrently, all $10^5$ 96-bit keys can be searched against an input key concurrently.

FIG. 19 looks at accelerating a genome sequence for the example of long keys (960 bits each) where there are $10^5$ such keys to be searched by an input key to look for matches. In this example, the NAND block is again taken to have 4096 bit lines and 96 word lines, with the CAM cell made of a pair memory cells and the word lines paired, so that a single block can store 48 bits for a given key on each bit line of a block. Consequently, a single 960-bit key can be stored in the bit lines of 20 combined blocks that form a single plane, where for a match for the final match FM value of bit line the matching combined circuit MC will signal a match if there is a match in all 20 parts of the key. Therefore, a single plane can provide searching over 4096 keys in parallel. For storing $10^5$ such keys, the number of planes is 25, for a total of 50 blocks, where the last plane (Plane 24) is partially mapped (using 1696 of 4096 bit lines). By activating the 500 blocks concurrently, all $10^5$ 960 bit keys can be searched against an input key concurrently. The search throughput and the total latency are inversely proportional to the level of parallelism of blocks and planes (i.e., the maximum number of blocks can be activated in parallel). For instance, if only 50 blocks can be activated in parallel, the latency will be increased by 10x. Meanwhile, the search throughput is reduced by 10x (the same rate as for with 96-bit key length FIG. 18). By introducing a custom block size (i.e., the number of bit lines) and leveraging both block and plane parallelism, a NAND-based CAM search system can improve the throughput and total latency. It should also be noted that although the examples of FIGS. 18 and 19 activate a large number of word lines and bit lines concurrently, the number of matches is usually quite small, so that the power and current consumption will tend to be less that would be expected for normal read operations of a similarly degree of parallelism.

Figure 20:
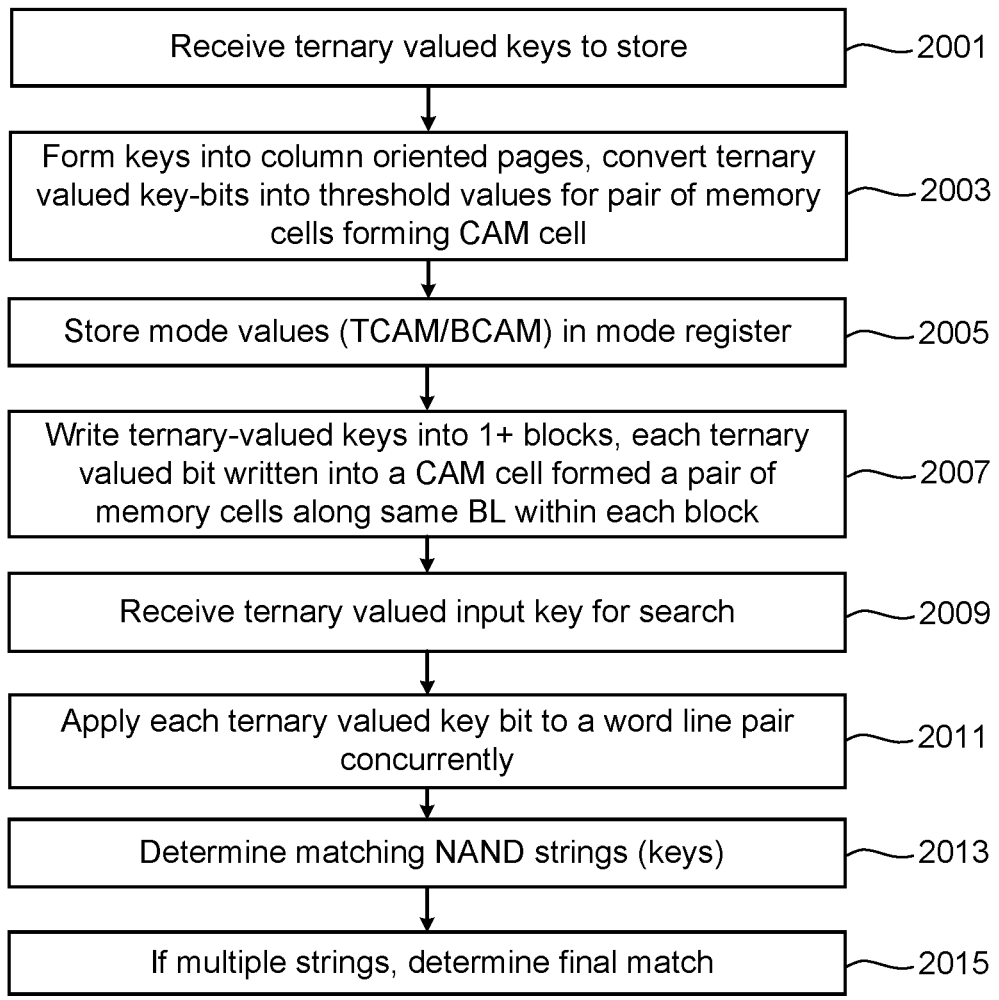
FIG. 20 is a flowchart for an embodiment of operating a scalable search system with SLC NAND-based BCAM/TCAM cells as described above with respect FIGS. 7-19 for a memory system based on the embodiments described with respect to FIGS. 1-6B.

FIG. 20 is a flowchart for an embodiment of operating a scalable search system with SLC NAND-based BCAM/TCAM cells as described above with respect FIGS. 7-19 for a memory system based on the embodiments described with respect to FIGS. 1-6B. Steps 2001, 2003, 2005, and 2007 relate to storing a set of keys within the memory system and steps 2009, 2011, 2013 and 2015 relate to performing a search.

Staring at step 2001 the memory system receives a set of ternary valued keys that are to be stored for searching. Referring to FIG. 1, the keys can be provided by host 120 to controller 102 of memory system 100. As described above, the keys are stored along bit lines in column orientation. As data is written as pages along the rows of word lines, the keys values need to be rearranged to have a column orientation and formed into pages. Additionally, as illustrated in FIG. 13 or 14, as each ternary key bit value is stored a CAM memory cell formed of a memory cell pair along a word line pair, a row of key values corresponds to two pages of data. Depending on the embodiment, the rearranging of keys into a column orientation and formation into pages can be performed on the controller 102, the memory die 300 of FIG. 5 or memory die pair 604 of FIG. 6A, or some combination of these. For example, the controller 102 could accumulated the keys in local memory 106, then form these into pages that are sent to memory packages 104 to be written into the memory die. In another example, in a bonded die pair as in FIGS. 6A and 6B, the control die 608 could take advantage of the relative amount of space opened up having memory cells on the die 610 and have the capability to accumulate and reorient the keys within the bonded die pair. If the memory can be selectively operated in both a BCAM and a TCAM mode, along with receiving binary or ternary valued keys, a register value (such as in mode register 313) can be set at step 2005 to indication the corresponding operation mode. The pages of data corresponding to the keys are then written in step 2007, where this can be performed in a standard binary programming operation. For example, the word line driver 1313, bit line driver 1311, and sense amplifiers SA 1315-j can write the key bit values into the CAM cells of the block of FIG. 13 in a word line by word line programming sequence. The number of blocks into which the keys are written will be based on the size and number of the keys, where the keys can be spread across multiple plane and multiple blocks as illustrated in FIGS. 16-19.

Once the keys are written, they can be searched starting at step 2009. The host 120 can transmit a ternary valued key to the controller 102 and then on to the memory dies to be searched. As describe with respect to the truth table of FIG. 11 and architecture of FIG. 13, the ternary bit values are converted into voltage value pairs and applied to the word line pairs by the word line driver 1313 at step 2011. If the memory is operable in both the BCAM and TCAM mode, the mode register value can be checked to determine the mode and set the word line voltages accordingly. Step 2013 determines which of the bit lines conduct, indicating the input ternary value key for the search matches the key stored in the corresponding bit line, by the sense amplifiers SA 1315-j. If the keys are spread across multiple blocks, such as illustrated by the examples of FIGS. 16-19, the match results for each of the sub-keys are then checked in the matching combined circuit 1419-j to generate the final match value at step 2015. Once any matches are determined, the results can be reported out to the host or used for subsequent operations on the memory system. For example, if data is stored in a key-value arrangement, once a key is identified at step 2015, the memory system can get the corresponding data values from another memory location and provide this data to the host.

Figure 21:
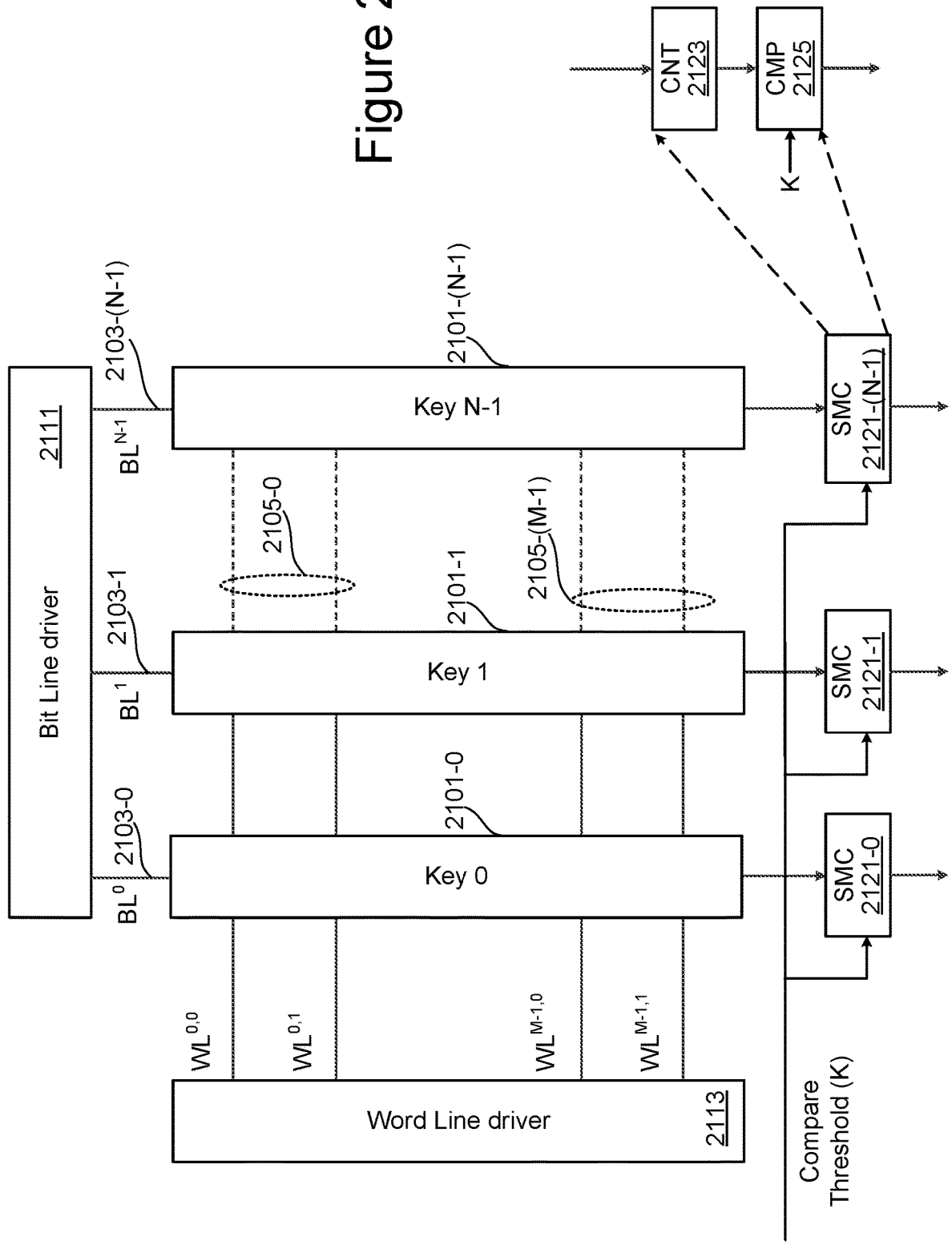
FIGS. 21-23 describe the application of the SLC NAND based BCAM/TCAM structure to accelerate the K-nearest neighbors problem.
Figure 22:
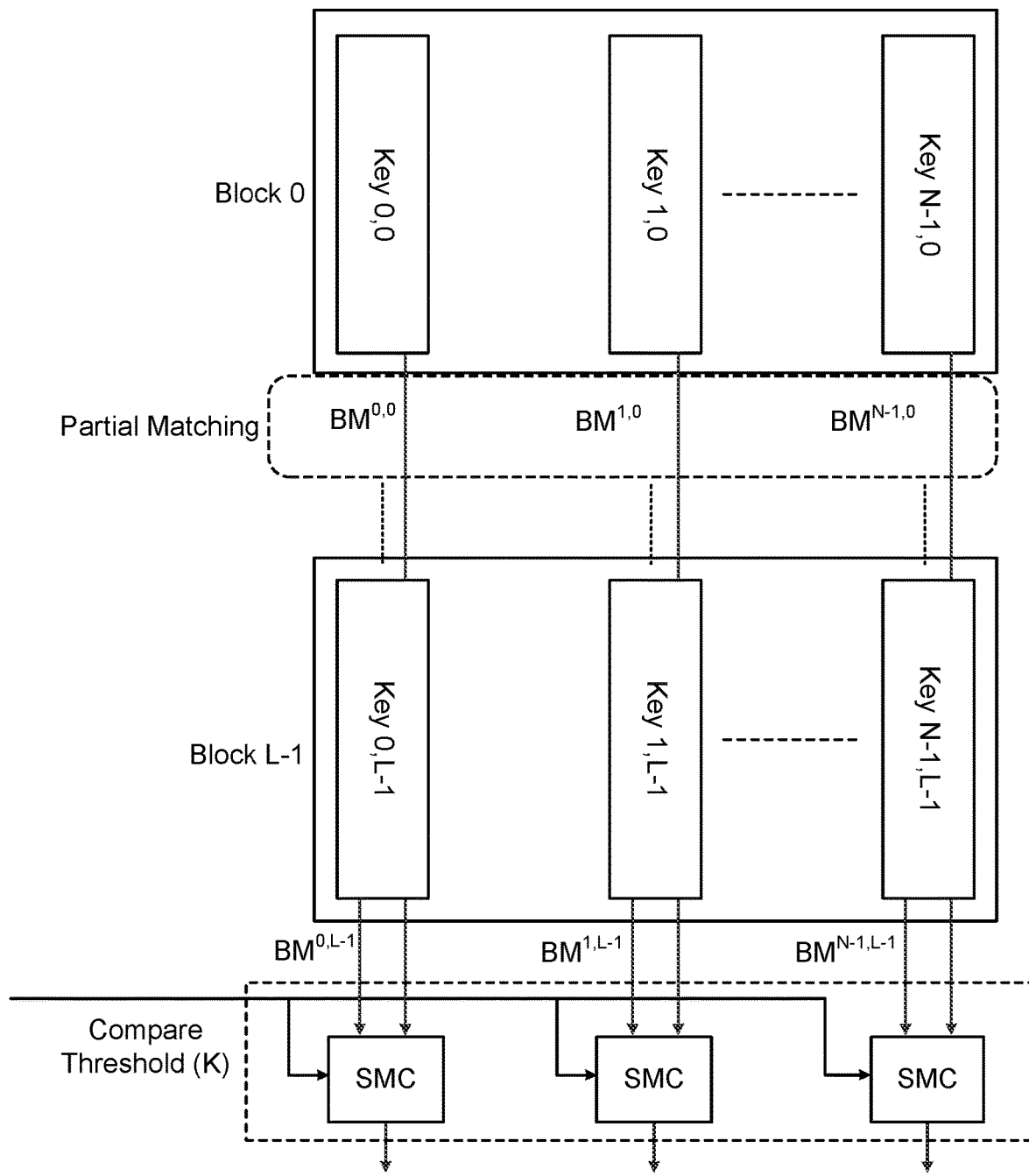
Figure 23:
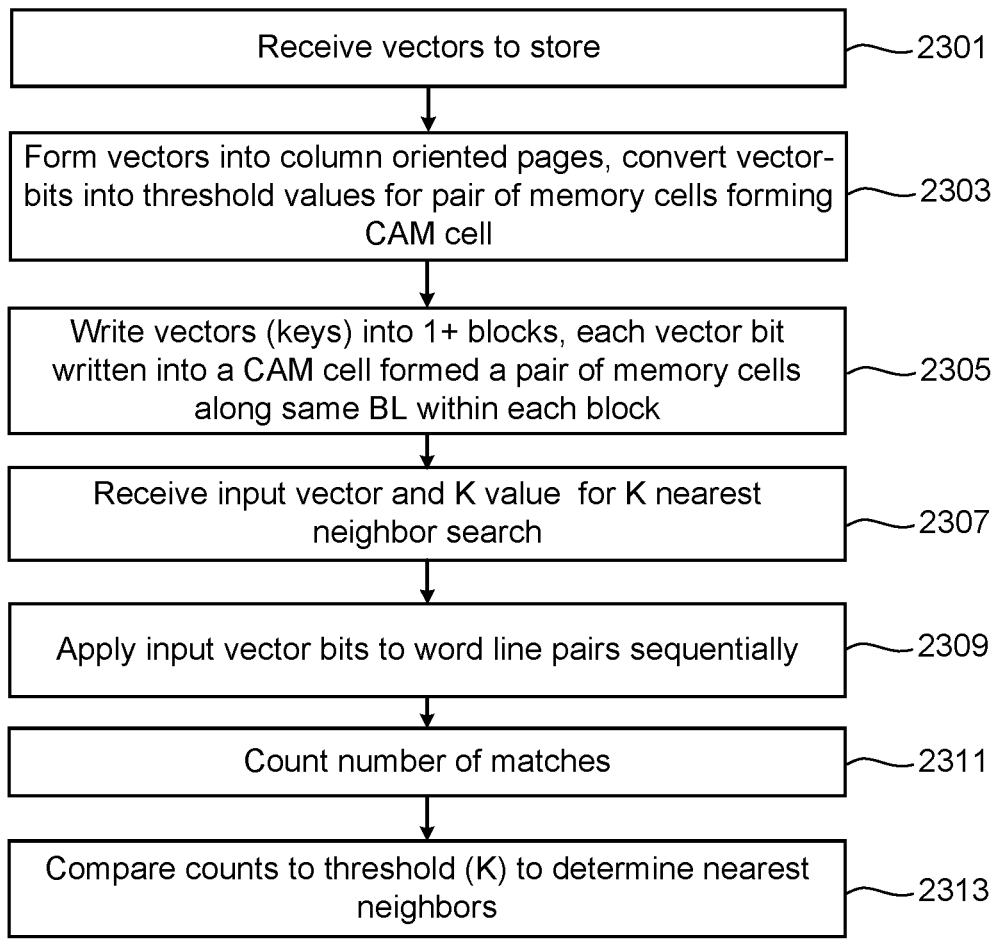

FIGS. 21-23 describe the application of the SLC NAND based BCAM/TCAM structure to accelerate the K-nearest neighbors problem. The K-nearest neighbors (KNN) problem is, given a set of binary feature vectors {M} and an binary input vector [n], the requirement is to find all the "nearest neighboring" vectors [m'] from {M} that fulfill Ham(n, $m_i$) <K, where Ham(n, $m_i$), or the Hamming distance, is calculated as the number of bit positions between vector n and vector $m_i$ at which the corresponding bits are different. KNN, as a simple supervised machine learning algorithm, has been widely used to solve classical classification and regression problems. A major drawback of KNN as usually implemented is that its performance is dramatically reduced when the size of searched data set grows beyond on-chip/DRAM memory capacity.

FIG. 21 is laid out and operates similarly to FIG. 14, where Key j 2101-j is stored along bit line $BL^j$ 2103-j, which is connected to the bit line driver 2111, and the word line pairs ($WL^{i,0}$, $WL^{i,1}$) 2105-i are connected to the word line driver 2113. As also represented in FIG. 14, the sense amplifier for each of the bit lines is not shown, but can be arranged as in FIG. 13. Instead of the corresponding match lines $BM^j$ of FIG. 14, each bit line $BL^j$ 2103-j of FIG. 21 is now connected to a similarity measured circuit $SMC^j$ 2121-j.

As seen by the similarity of the architectures, the SLC NAND-based BCAM/TCAM array can be leveraged to support K nearest neighbor searching. The set of feature vectors are pre-programmed to SLC-based BCAM/TCAM array, each search key on one of the bit lines, and the input vector is programmed via the voltage levels applied to the word line pairs. For each bit line 2103-j, the similarity measured circuit $SMC^j$ 2121-j includes a counter $CNT^j$ 2123-j and a comparator $CMP^j$ 2125-j. As input vector is sequentially applied to the word line pairs, the counter $CNT^j$ 2123-j counts the number of times that the input key bit applied to the word line pair matches the stored key bit in CAM cell on the corresponding word line pair and bit line. Depending on the embodiment, the counter $CNT^j$ 2123-j can either keep a running count of either the number of matches or the number of non-matches, where the maximum size of the counter is log2(total number of word lines). For example, in one embodiment the value of the count is only incremented when the bit line output is high (or match). The comparator $CMP^j$ 2125-j can be a pre-programmed threshold which is initialized as K, where, for example K could be a register value or have a value specified and received along with the input key vector. In an embodiment where K specifies a maximum distance between an input vector and a stored vector (i.e., number of non-matches), this corresponds to the number of matches being equal to or greater than (M-K), where M is the key length and K is less than or equal to M. When the $CMP^j$ 2125-j finds that the value of counter $CNT^j$ 2123-j is equal to (M-K), the counter can stop counting because a K-nearest neighbor has been found, and the output of $SMC^j$ 2121-j is asserted which indicates the search key in bit line $BL^j$ 2103-j is a K-nearest neighbor of input vector. By reading the output of all of the SMCs, all the K-nearest neighbors from the stored vectors can be found.

FIG. 22 illustrates the scaling up of the SLC NAND-based BCAM/TCAM array architecture of FIG. 21 to support finding the K-nearest neighbors of long input vectors. FIG. 22 illustrates mapping long feature vectors (stored keys) and input vector across multiple SLC NAND-based BCAM/TCAM arrays. In the illustrated embodiment, a long feature vector of Key j is split into L partial Keys, Key j,0 to Key j,(L-1), that are respectively stored along bit line j of block 0 to block (L-1). The partial matching outputs $BM^{j,i}$ of same bit line provided by each of the multiple NAND blocks are routed to the corresponding SMC, circuit which has a counter modified (relative to FIG. 21) to provide a combined count for all of the blocks for the bit line; that is, the "modified" counter of SMC is increased by total number of partial matching outputs which are asserted. Relative to the sequence matching architecture of FIGS. 14-19, the K-nearest neighbors architecture of FIGS. 21 and 22 is somewhat more complicated due to the similarity measured circuit being more complex than the matching circuit. The K-nearest neighbors architecture of FIGS. 21 and 22 is flexible as it can also support sequence matching applications by setting the counter thresholds equal to the key lengths (i.e., the input and stored keys match exactly) so that the outputs of SMC indicate the matching between input vector and search keys.

FIG. 23 is a flowchart for an embodiment of operating a K nearest neighbor search system with SLC NAND-based BCAM/TCAM cells as described above with respect FIGS. 21 and 22 for a memory system based on the embodiments described with respect to FIGS. 1-6B. Steps 2301, 2303, and 2305 relate to storing a set of vectors (keys) with the memory system and steps 2307, 2309, 2311 and 2313 relate to the search. The flow of FIG. 23 corresponds in many respects to the flow of FIG. 20.

Staring at step 2301 the memory system receives a set of vectors that are to be stored for searching. Referring to FIG.

1, the vectors can be provided by host 120 to controller 102 of memory system 100. As described above, the vectors are stored along bit lines in column orientation. As data is written as pages along the rows of word lines, the vector values need to be rearranged to have a column orientation and formed into pages. Additionally, similarly to keys values as illustrated in FIG. 13 or 14, as each of a vector's key bit value is stored in a CAM memory cell formed of a memory cell pair along a word line pair, a row of vector values corresponds to two pages of data. Depending on the embodiment, the rearranging of the vectors into a column orientation and formation into pages can be performed on the controller 102, the memory die 300 of FIG. 5 or memory die pair 604 of FIG. 6A, or some combination of these. For example, the controller 102 could accumulated the vectors in local memory 106, then form these into pages that are sent to memory packages 104 to be written into the memory die. In another example, in a bonded die pair as in FIGS. 6A and 6B, the control die 608 could take advantage of the relative amount of space opened up having memory cells on the die 610 and have the capability to accumulate and reorient the vectors within the bonded die pair. The pages of data corresponding to the vectors are then written in step 2305, where this can be performed in a standard binary programming operation. For example, the word line driver 2113, bit line driver 2111, and sense amplifiers can write the vector bit values into the CAM cells of the block of FIG. 13 in word line by word line programming sequence. The number of blocks into which the vector, or key, values are written will be based on the size and number of the vectors, where the keys can be spread across multiple plane and multiple blocks as illustrated in FIG. 22.

Once the vectors are written, they can be searched starting at step 2307. The host 120 can transmit a search vector to the controller 102 and then on to the memory dies to be searched. The K value for the search based on the input vector can also be supplied as part of step 2307. As describe with respect to the truth table of FIG. 11 and architecture of FIG. 13, the bit values of the input vector are converted into voltage value pairs and applied sequentially to the word line pairs of the block by the word line driver 2113 at step 2309, where the non-selected word lines of the block at each read are set to the pass voltage. Step 2311 counts the number of matches along the corresponding bit line, as counted by the counter CNT 2123-j for the bit line, whether in a single block as in FIG. 21 or the combined count of multiple blocks as in FIG. 22, as the CAM cells along the bit line are checked at step 2309. Step 2313 compares the count to the threshold value K to see which vectors stored as keys are K nearest neighbors of the input vector, where the result can then be reported out to the host or used in further processing.

The large-scale SLC NAND-based BCAM/TCAM system presented above can outperform other implementations according to a number of metrics, such as cost effectiveness in terms of cost per bit; scalability for long search key and large key size; performance due to high parallelism across block and/or planes ; and in energy efficiency. The techniques can also benefit application domain using large amount of data, such as genome sequencing, with the use ternary values allows for both approximate and exact searching. As illustrated by the K nearest neighbor example, the techniques can also be applied to large-scale database processing such as query search systems (i.e., key-value systems); data filtering, data compression; and classification (i.e., K nearest neighbor search).

According to a first set of aspects, a non-volatile memory device includes a control circuit configured to connect to one or more arrays of non-volatile memory cells having a NAND type architecture in which the memory cells are connected along bit lines and word lines. The control circuit is configured to receive from a host a plurality of keys each having a plurality of ternary valued bits and to write a first plurality of bits from each of a plurality of the keys into a corresponding bit line of a first of the arrays of non-volatile memory cells, each of the ternary valued bits of the keys being written into a pair of memory cells each connected to a corresponding pair of word lines. The control circuit is also configured to: subsequent to writing the first plurality of bits from each of the plurality of the keys into the corresponding bit line of the first array, receive an input key having a plurality of ternary valued bits; compare the first plurality of the ternary valued bits from the input key to the first plurality of bits from each of the plurality of the keys as written into the corresponding bit line of the first array; and determine a number of the ternary valued bits from the input key that match the first plurality of bits from each of the plurality of the keys as written into the corresponding bit line of the first array.

In additional aspects, a method includes receiving a plurality of ternary valued keys from a host and writing a first plurality of bits from each of a plurality of the keys into a corresponding bit line of a first block of one of a plurality of arrays of non-volatile memory cells having a NAND type architecture, each of the bits of the ternary valued keys being written into a pair of memory cells each connected to a corresponding pair of word lines. The method also includes: subsequent to writing the first plurality of bits from each of the plurality of the keys into a corresponding bit line of the first block, receiving a ternary valued input key having a plurality of bits; converting each of a first plurality of the bits from the ternary valued input key into a corresponding one of a first plurality of pairs of voltage levels; applying each of the first plurality of corresponding pairs of voltage levels to one of the pairs of word lines; and in response to applying each of the first plurality of corresponding pairs of voltage levels to one of the pairs of word lines, determining a number of the first plurality of the bits from the ternary valued input key that match the first plurality of bits from each of the plurality of the keys written into the corresponding bit line of the first block of non-volatile memory cells.

In another set of aspects, an apparatus includes a non-volatile memory device including a control circuit configured to connect to one or more arrays of non-volatile memory cells having a NAND type architecture in which the memory cells are connected along bit lines and word lines. The control circuit is configured to: receive from a host a plurality of vectors each having a plurality of bits and write a first plurality of bits from each of the plurality of the vectors into a corresponding bit line of a first of the arrays of non-volatile memory cells, each of the bits of the vectors being written into a pair of memory cells each connected to a corresponding pair of word lines. The control circuit is further configured to: subsequent to writing the first plurality of bits from each of the plurality of the vectors into the corresponding bit line of the first array, receive a search vector having a plurality bits; convert each of a first plurality of the bits from the search vector into a corresponding one of a first plurality of pairs of voltage levels; sequentially apply each of the first plurality of corresponding pairs of voltage levels to one of the pairs of word lines; and in response to sequentially applying each of the first plurality of corresponding pairs of voltage levels to one of the pairs of word lines, maintain a count of a number of the first plurality of the bits from the search vector that match the first plurality of bits from each of the plurality of the vectors written into the corresponding bit line of the first array of the non-volatile memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
a control circuit configured to connect to one or more arrays of non-volatile memory cells having a NAND type architecture in which the memory cells are connected along bit lines and word lines, the control circuit is configured to:
  receive from a host a plurality of keys each having a plurality of ternary valued bits;
  write a first plurality of bits from each of a plurality of the keys into a corresponding bit line of a first of the arrays of non-volatile memory cells, each of the ternary valued bits of the keys being written into a pair of memory cells each connected to a corresponding pair of word lines;
  subsequent to writing the first plurality of bits from each of the plurality of the keys into the corresponding bit line of the first array, receive an input key having a plurality of ternary valued bits;
  compare the first plurality of the ternary valued bits from the input key to the first plurality of bits from each of the plurality of the keys as written into the corresponding bit line of the first array; and
  determine a number of the ternary valued bits from the input key that match the first plurality of bits from each of the plurality of the keys as written into the corresponding bit line of the first array.

2. The non-volatile memory device of claim 1, wherein the control circuit is formed on a control die, the non-volatile memory device further comprising:
a memory die including the first array of non-volatile memory cells, the memory die formed separately from and bonded to the control die.

3. The non-volatile memory device of claim 1, wherein, to compare the first plurality of the ternary valued bits from the input key to the first plurality of bits from each of the plurality of the keys as written into the corresponding bit line of the first array, the control circuit is configured to:
  convert each of a first plurality of the ternary valued bits from the input key into a corresponding one of a first plurality of pairs of voltage levels; and
  apply each of the first plurality of corresponding pairs of voltage levels to one of the pairs of word lines, and
  wherein, to determine a number of the ternary valued bits from the input key that match the first plurality of bits from each of the plurality of the keys as written into the corresponding bit line of the first array, the control circuit is configured to:
    maintain a count of a number of the ternary valued bits from the input key that match the first plurality of bits from each of the plurality of the keys as written into the corresponding bit line of the first array.

4. The non-volatile memory device of claim 3, wherein the control circuit is further configured to:
  compare the count for each of the plurality of the keys as written into the corresponding bit line of the first array to a threshold value.

5. The non-volatile memory device of claim 1, further comprising:
a memory controller, the memory controller configured to:
  receive the plurality of keys each having the plurality of ternary valued bits from the host; and
  prior to writing the first plurality of bits from each of the plurality of the keys into the corresponding bit line of the first array, form the first plurality of bits from each of the plurality of the keys into a plurality of pages of data.

6. The non-volatile memory device of claim 1, the control circuit further configured to:
  prior to writing the first plurality of bits from each of the plurality of the keys into the corresponding bit line of the first array, form the first plurality of bits from each of the plurality of the keys into a plurality of pages of data.

7. The non-volatile memory device of claim 1, wherein each of the plurality of the keys further includes a second plurality of ternary valued bits, the input key having a second plurality of ternary valued bits, and the first plurality of bits from each of the plurality of the keys are written into a first block of the first array, the control circuit further configured to:
  write the second plurality of bits from each of the plurality of the keys into the corresponding bit line of a second block of the first array, each of the ternary valued bits of the keys being written into a pair of memory cells each connected to a corresponding pair of word lines of the second block;
  compare the second plurality of the ternary valued bits from the input key to the second plurality of bits from each of the plurality of the keys as written into the corresponding bit line of the second block of the first array; and determine a number of the ternary valued bits from the input key that match the second plurality of bits from each of the plurality of the keys as written into the corresponding bit line of the second block of the first array.

8. The non-volatile memory device of claim 1, wherein each of the plurality of the keys further includes a second plurality of ternary valued bits and the input key having a second plurality of ternary valued bits, the control circuit further configured to:
  write the second plurality of bits from each of the plurality of the keys into the corresponding bit line of a second of the arrays of non-volatile memory cells, each of the ternary valued bits of the keys being written into a pair of memory cells each connected to a corresponding pair of word lines of the second array;
  convert each of the second plurality of the ternary valued bits from the input key into a corresponding one of a second plurality of pairs of voltage levels;
  compare the second plurality of the ternary valued bits from the input key to the second plurality of bits from each of the plurality of the keys as written into the corresponding bit line of the second array of non-volatile memory cells; and
  determine a number of the ternary valued bits from the input key that match the second plurality of bits from each of the plurality of the keys as written into the corresponding bit line of the second array.

9. The non-volatile memory device of claim 1, wherein a first of the ternary valued bits of the keys are written into the corresponding pair of memory cells by writing a first of the pair of memory cells to a high threshold voltage value and a second of the pair of memory cells to a low threshold voltage value,
  a second of the ternary valued bits of the keys are written into the corresponding pair of memory cells by writing the first of the pair of memory cells to the low threshold voltage value and the second of the pair of memory cells to the high threshold voltage value, and
  a third of the ternary valued bits of the keys are written into the corresponding pair of memory cells by writing both of the first and second of the pair of memory cells to the low threshold voltage value.

10. The non-volatile memory device of claim 1, wherein the control circuit is configured to convert each of the first plurality of the ternary valued bits from the input key into the corresponding one of the first plurality of pairs of voltage levels by converting a first of the ternary valued bits of the input keys into a high voltage value for a first of the pair of voltage levels and a low voltage value for a second of the pair of voltages levels,
  converting the second of the ternary valued bits of the input keys into the low voltage value for the first of the pair of voltage levels and the high voltage value for the second of the pair of voltages levels, and
  converting the third of the ternary valued bits of the input keys into the high voltage value for both of the first and second of the pair of voltage levels.

11. A method, comprising:
  receiving a plurality of ternary valued keys from a host;
  writing a first plurality of bits from each of a plurality of the keys into a corresponding bit line of a first block of one of a plurality of arrays of non-volatile memory cells having a NAND type architecture, each of the bits of the ternary valued keys being written into a pair of memory cells each connected to a corresponding pair of word lines;
  subsequent to writing the first plurality of bits from each of the plurality of keys into a corresponding bit line of the first block, receiving a ternary valued input key having a plurality of bits;
  converting each of a first plurality of the bits from the ternary valued input key into a corresponding one of a first plurality of pairs of voltage levels;
  applying each of the first plurality of corresponding pairs of voltage levels to one of the pairs of word lines; and
  in response to applying each of the first plurality of corresponding pairs of voltage levels to one of the pairs of word lines, determining a number of the first plurality of the bits from the ternary valued input key that match the first plurality of bits from each of the plurality of the keys written into the corresponding bit line of the first block of non-volatile memory cells.

12. The method of claim 11, wherein determining the number of the first plurality of the bits from the ternary valued input key that match the first plurality of bits from each of the plurality of the keys written into the corresponding bit line of the first block of non-volatile memory cells incudes:
  determining whether the corresponding bit line into which the first plurality of bits from the corresponding one of the plurality of the keys conducts in response to applying each of the first plurality of corresponding pairs of voltage levels to one of the pairs of word lines.

13. The method of claim 11, wherein each of the plurality of the ternary valued keys further includes a second plurality of bits, the ternary valued input key having a second plurality of bits the method further comprising:
  writing the second plurality of bits from each of a plurality of the ternary valued keys into the corresponding bit line of a second block of one of the arrays of non-volatile memory cells, each of the bits of the ternary valued keys being written into a pair of memory cells each connected to a corresponding pair of word lines of the second block; converting each of the second plurality of the bits from the ternary valued input key into a corresponding one of a second plurality of pairs of voltage levels;
  applying each of the second plurality of corresponding pairs of voltage levels to one of the pairs of word lines of the second block; and
  in response to applying each of the second plurality of corresponding second pairs of voltage levels to one of the second pairs of word lines, determine a number of the second plurality of the bits from the ternary valued input key that match the second plurality of bits from each of the plurality of the keys written into the corresponding bit line of the second block of the non-volatile memory cells.

14. A non-volatile memory device, comprising:
  a control circuit configured to connect to one or more arrays of non-volatile memory cells having a NAND type architecture in which the memory cells are connected along bit lines and word lines, the control circuit is configured to:
    receive from a host a plurality of vectors each having a plurality of bits;
    write a first plurality of bits from each of the plurality of the vectors into a corresponding bit line of a first of the arrays of non-volatile memory cells, each of the bits of the vectors being written into a pair of memory cells each connected to a corresponding pair of word lines;

subsequent to writing the first plurality of bits from each of the plurality of the vectors into the corresponding bit line of the first array, receive a search vector having a plurality bits;

convert each of a first plurality of the bits from the search vector into a corresponding one of a first plurality of pairs of voltage levels;

sequentially apply each of the first plurality of corresponding pairs of voltage levels to one of the pairs of word lines; and in response to sequentially applying each of the first plurality of corresponding pairs of voltage levels to one of the pairs of word lines, maintain a count of a number of the first plurality of the bits from the search vector that match the first plurality of bits from each of the plurality of the vectors written into the corresponding bit line of the first array of the non-volatile memory cells.

15. The non-volatile memory device of claim 14, wherein the control circuit is formed on a control die, the non-volatile memory device further comprising:

a memory die including the arrays of memory cells, the memory die formed separately from and bonded to the control die.

16. The non-volatile memory device of claim 14, wherein the control circuit is further configured to:

compare the count for each of the plurality of the vectors as written into the corresponding bit line of the first array of the non-volatile memory cells to a threshold value; and determine those of the plurality of the vectors as written into the corresponding bit line of the first array match the first plurality of the bits of the search vector for which the count exceeds the threshold value.

17. The non-volatile memory device of claim 14, further comprising:

a memory controller, the memory controller configured to:

receive the plurality of vectors each having the plurality of bits from the host; and prior to writing the first plurality of bits from each of the plurality of the vectors into the corresponding bit line of the first of non-volatile memory cells, form the first plurality of bits from each of the plurality of the vectors into a plurality of pages of data.

18. The non-volatile memory device of claim 14, the control circuit further configured to:

prior to writing the first plurality of bits from each of the plurality of the vectors into the corresponding bit line of the first array of non-volatile memory cells, form the first plurality of bits from each of the plurality of the vectors into a plurality of pages of data.

19. The non-volatile memory device of claim 14, wherein each of the plurality of the vectors further includes a second plurality of bits, the search vector having a second plurality of bits, and the first plurality of bits from each of the plurality of the vectors are written into a first block of the first array, the control circuit further configured to:

write the second plurality of bits from each of the plurality of the vectors into the corresponding bit line of a second block of the first array of non-volatile memory cells, each of the bits of the vectors being written into a pair of memory cells each connected to a corresponding pair of word lines of the second block;

convert each of the second plurality of the bits from the search vector into a corresponding one of a second plurality of pairs of voltage levels;

sequentially apply each of the second plurality of corresponding pairs of voltage levels to one of the pairs of word lines of the second block; and in response to sequentially applying each of the second plurality of corresponding second pairs of voltage levels to one of the second pairs of word lines, maintain a count of a number of the second plurality of the bits from the search vector that match the second plurality of bits from each of the plurality of the vectors written into the corresponding bit line of the second array of the non-volatile memory cells.

20. The non-volatile memory device of claim 14, wherein each of the plurality of the vectors further includes a second plurality of bits and the search vector having a second plurality of bits, the control circuit further configured to:

write the second plurality of bits from each of the plurality of the vectors into the corresponding bit line of a second of the arrays of non-volatile memory cells, each of the bits of the vectors being written into a pair of memory cells each connected to a corresponding pair of word lines of the second array;

convert each of the second plurality of the bits from the search vector into a corresponding one of a second plurality of pairs of voltage levels;

sequentially apply each of the second plurality of corresponding pairs of voltage levels to one of the pairs of word lines of the second array; and in response to sequentially applying each of second plurality of corresponding second pairs of voltage levels to one of the pairs of word lines of the second array, maintain a count of a number of the second plurality of the bits from the search vector that match the second plurality of bits from each of the plurality of the vectors written into the corresponding bit line of the second array of the non-volatile memory cells.

* * * * *